(12) United States Patent
Wirth et al.

(10) Patent No.: US 7,531,060 B2
(45) Date of Patent: May 12, 2009

(54) INTEGRATED TOOL ASSEMBLIES WITH INTERMEDIATE PROCESSING MODULES FOR PROCESSING OF MICROFEATURE WORKPIECES

(75) Inventors: Paul Wirth, Columbia Falls, MT (US); Daniel J. Woodruff, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 727 days.

(21) Appl. No.: 11/178,250

(22) Filed: Jul. 7, 2005

(65) Prior Publication Data
US 2007/0009344 A1  Jan. 11, 2007

Related U.S. Application Data

(60) Provisional application No. 60/856,981, filed on Jul. 9, 2004.

(51) Int. Cl.
*C23F 1/00* (2006.01)
*H01L 21/306* (2006.01)

(52) U.S. Cl. .................. 156/345.11; 118/400; 204/242; 204/640

(58) Field of Classification Search .................. 29/560, 29/563, 564, 742, 759; 427/99.5; 118/400, 118/719; 205/157, 640; 204/242, 298.25; 216/91; 156/345.11, 345.32, 345.31
See application file for complete search history.

(56) References Cited

U.S. PATENT DOCUMENTS

| 4,722,298 A * | 2/1988 | Rubin et al. ................. 118/715 |
| 5,733,024 A | 3/1998 | Slocum et al. |
| 6,350,319 B1 | 2/2002 | Curtiss |
| 6,413,436 B1 | 7/2002 | Aegerter |
| 6,423,642 B1 | 7/2002 | Peace |
| 6,569,297 B2 | 5/2003 | Wilson et al. |
| 6,660,137 B2 | 12/2003 | Wilson et al. |
| 6,749,390 B2 | 6/2004 | Woodruff |
| 6,752,584 B2 | 6/2004 | Woodruff |
| 6,962,471 B2 | 11/2005 | Birkner et al. |
| 7,371,306 B2 * | 5/2008 | Davis et al. ............ 156/345.22 |
| 2001/0032788 A1 | 10/2001 | Woodruff et al. |

(Continued)

OTHER PUBLICATIONS

U.S. Appl. No. 60/586,514, Wirth.

*Primary Examiner*—Erica E Cadugan
(74) *Attorney, Agent, or Firm*—Perkins Coie LLP; Kenneth H. Ohriner; Craig E. Bohn

(57) ABSTRACT

An intermediate module comprising a dimensionally stable mounting module and a first device attached to the dimensionally stable mounting module. The dimensionally stable mounting module can include a front docking unit with front alignment elements for connecting the mounting module to a load/unload module, and a rear docking unit with rear alignment elements for connecting the mounting module to a main processing unit. The mounting module can further include a deck between the front docking unit and the rear docking unit, positioning elements at the deck, and attachment elements at the deck. The first device can be a processing chamber, an annealing station, a metrology station, a buffer station, or another type of component for holding or otherwise performing a function on a workpiece. The first device has a device interface member engaged with one of the positioning elements and a device fastener engaged with one of the attachment elements so that the first device is positioned precisely at a known location in a fixed reference frame defined by the mounting module.

21 Claims, 14 Drawing Sheets

U.S. PATENT DOCUMENTS

| | | |
|---|---|---|
| 2002/0032499 A1 | 3/2002 | Wilson et al. |
| 2002/0125141 A1 | 9/2002 | Wilson et al. |
| 2002/0139678 A1 | 10/2002 | Wilson et al. |
| 2003/0057093 A1 | 3/2003 | Klocke et al. |
| 2003/0068837 A1 | 4/2003 | Klocke et al. |
| 2003/0070918 A1 | 4/2003 | Hanson |
| 2003/0079989 A1 | 5/2003 | Klocke et al. |
| 2003/0127337 A1 | 7/2003 | Hanson et al. |
| 2003/0159921 A1 | 8/2003 | Harris et al. |
| 2004/0013808 A1 | 1/2004 | Hanson et al. |
| 2005/0034809 A1 | 2/2005 | Woodruff et al. |
| 2005/0087439 A1 | 4/2005 | Hanson et al. |
| 2005/0109088 A1 | 5/2005 | Woodruff et al. |
| 2006/0009047 A1* | 1/2006 | Wirth et al. ......... 438/800 |
| 2006/0045666 A1* | 3/2006 | Harris et al. ......... 414/217 |
| 2007/0020080 A1* | 1/2007 | Wirth ......... 414/744.5 |

* cited by examiner

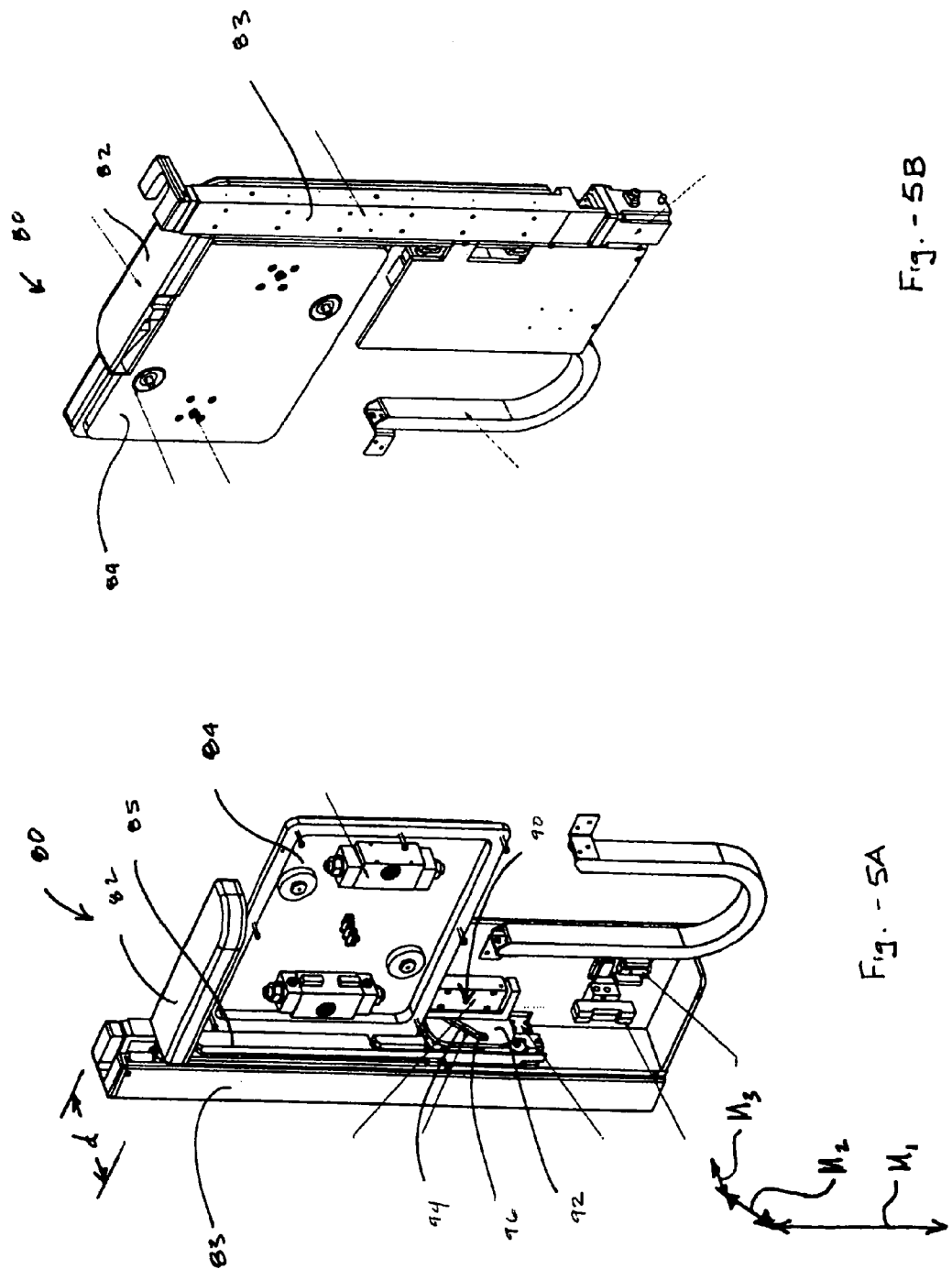

INTEGRATED TOOL ASSEMBLIES WITH INTERMEDIATE PROCESSING MODULES FOR PROCESSING OF MICROFEATURE WORKPIECES

CROSS-REFERENCE TO RELATED APPLICATION

This application claims benefit to U.S. Provisional Application No. 60/856,981, filed Jul. 9, 2004, which is hereby incorporated in its entirety.

TECHNICAL FIELD

The present invention is directed toward apparatus and methods for processing microfeature workpieces having a plurality of microdevices integrated in and/or on the workpieces. The microdevices can include submicron features. Particular aspects of the invention are directed toward intermediate modules that can be combined with main processing units to customize the functionality of wet chemical processing tools or tools with other types of processing stations.

BACKGROUND

Microdevices are manufactured by depositing and working several layers of materials on a single substrate to produce a large number of individual devices. For example, layers of photoresist, conductive materials, and dielectric materials are deposited, patterned, developed, etched, planarized, and otherwise manipulated to form features in and/or on a substrate. The features are often arranged to form integrated circuits, micro-fluidic systems, and other structures. Wet chemical processes are commonly used to form features on microfeature workpieces, clean the surface of workpieces, etch material from the workpieces and/or otherwise prepare the workpieces for subsequent processing. Wet chemical processes are generally performed in wet chemical processing tools that have a plurality of individual processing chambers for cleaning, etching, electrochemically depositing materials, or performing combinations of these processes. The processing chambers can accordingly be rinse/dry chambers, cleaning capsules, etching capsules, electrochemical deposition chambers, or other types of wet chemical processing chambers. Other processes, such as annealing, metrology, planarization, etc., are used to further process or analyze layers on the workpieces.

A typical wet chemical processing tool includes a housing or cabinet having a platform, a plurality of wet chemical processing chambers in the cabinet, and a transport system. The tool can further include separate robots that raise and lower a head of the processing chambers for loading/unloading workpieces. The transport system can have several different configurations. In a linear configuration, the transport system includes a linear track and a robot that moves along the track to transport individual workpieces within the tool. The transport system can also access cassettes or pods at a load/unload module.

Automated handling of workpieces is an important aspect of manufacturing microelectronic devices. In general, a robot must accurately move workpieces among different processing chambers and other stations within a single tool. For example, many robots move workpieces to/from six to ten processing chambers and two to three pods. A linear track robot typically moves the workpieces among the processing chambers and the pods by moving along the track, rotating one or more links about several pivot points, and raising/lowering the workpiece in a variety of complex motions.

One challenge of handling workpieces is accurately calibrating the transport system to move workpieces to/from the processing chambers and the pods. The transport system is calibrated by manually "teaching" the robot the specific positions of the individual chambers and pods. For example, conventional calibration processes involve manually positioning the robot at a desired location with respect to each chamber and pod, and recording encoder values corresponding to the positions of the robot at each of these components. The encoder value is then inputted as a program value for the software that controls the motion of the robot. In addition to manually teaching the robot the specific locations within the tool, the arms and end-effectors of the robot are also manually aligned with the reference frame in which the program values are represented as coordinates. Although the process of manually aligning the components of the robot to the reference frame and manually teaching the robot the location of each component in the tool is an accepted method for setting up a tool, it is also extremely time-consuming and subject to operator error. For example, it can take approximately six to eight hours to align a robot to the reference frame and teach the robot the locations of ten chambers and two pods. Moreover, the quality of each point input as a program value is subject to operator error because it is often difficult to accurately position the robot in one or more of the chambers or pods.

Another challenge of operating integrated wet chemical processing tools is repairing/maintaining the processing chambers. Electrochemical deposition chambers, for example, require periodic maintenance because they have consumable electrodes that degrade over time. Additionally, byproducts from organic additives can collect in the plating solution such that the processing solution is changed periodically. One problem with repairing or maintaining existing wet chemical processing chambers is that the tool must be taken offline for an extended period of time to replace the chamber and manually recalibrate the robot. In fact, when only one processing chamber of the tool does not meet the specifications, it is often more efficient to continue operating conventional tools without stopping to repair the one out-of-specification processing chamber until more processing chambers do not meet the performance specifications. The loss of throughput of a single processing chamber, therefore, is not as severe as a loss of throughput caused by taking the tool offline to repair or maintain a single one of the processing chambers.

The practice of operating the tool until at least two processing chambers do not meet specifications severely impacts the throughput of the tool. For example, if the tool is not repaired or maintained until at least two or three processing chambers are out of specification, then the tool operates at only a fraction of its full capacity for a period of time before it is taken offline for maintenance. This increases the operating costs of the tool because the throughput not only suffers while the tool is offline to replace the wet processing chambers and reteach the robot, but the throughput is also reduced while the tool is operating because it operates at only a fraction of its full capacity. Moreover, as the feature sizes decrease, the electrochemical deposition chambers must consistently meet higher performance specifications. This causes the processing chambers to fall out of specifications sooner, which results in taking the tool offline more frequently. Therefore, the downtime associated with calibrating the transport system and repairing/maintaining electrochemical deposition chambers significantly impacts the costs of operating wet chemical processing tools.

These challenges are not limited to operating wet chemical processing tools, but rather other tools face similar challenges. For example, wafers are moved to/from annealing and metrology stations using automated handling equipment, and thus it is time-consuming to align robots with these types of processing stations as well.

Another aspect of wet chemical processing tools is cost-effectively manufacturing and installing the tools to meet demanding customer specifications. Many microelectronic companies develop proprietary processes that require custom wet chemical processing tools and/or other types of processing stations. For example, individual customers may need different combinations and/or different numbers of wet chemical processing chambers, annealing stations, metrology stations, and/or other components to optimize their process lines. Manufacturers of wet chemical processing tools accordingly custom-build many aspects of each tool to provide the functionality required by the particular customer and to optimize floor space, throughput, and reliability.

To meet the requirements of each individual customer, tool manufacturers typically produce tools having a main processing unit with a platform configured for a specific number of processing chambers and/or other types of stations. Tool manufacturers must accordingly provide several different platform configurations depending upon whether the individual customers require 2, 4, 6, 8, 10, etc., processing stations in a tool. It is expensive and inefficient to manufacture a large number of different platform configurations to meet the needs of the individual customers. Therefore, there is also a need to improve the cost-effectiveness for manufacturing wet chemical processing tools.

SUMMARY

One aspect of the present invention is directed toward universal intermediate modules having dimensionally stable mounting modules that can be coupled to dimensionally stable mounting modules of main processing units. In general, an intermediate module in accordance with the invention is configured to interface with a load/unload module and a main processing unit so that a robotic workpiece handling device and/or processing stations attached to the intermediate module are positioned precisely at predetermined locations within a fixed reference frame related to the main processing unit. Manufacturers of wet chemical processing tools can build many different combinations of robotic handling devices and processing stations using only a few intermediate modules in combination with main processing units. As a result, manufacturers of wet chemical processing tools can easily customize and/or augment the functionality of main processing units using an intermediate module without having to produce customized deck configurations for each tool. This is expected to significantly increase the efficiency and reduce the costs of manufacturing wet chemical processing tools.

A further aspect of the present invention is directed toward a calibration system for quickly aligning a robot of a transport system to operate with the intermediate module. More specifically, the calibration system can automatically align the robot to the reference frame of a mounting module in the intermediate module, or the calibration system can align the robot to a fixed reference frame of the main processing unit. In operation, the processing chambers or other processing stations are attached to the intermediate module at precise locations in the fixed reference frame such that the robot can interface with the processing modules or other stations without having to manually teach the robot the specific location of each component. It is expected that several embodiments of the automatic calibration system, when used in conjunction with the intermediate module, will enable the robot to be aligned with the fixed reference frame of the main processing unit and/or the intermediate module in a relatively short period of time. This is expected to reduce the time involved with installing and/or maintaining the intermediate processing modules.

Another aspect of the invention is directed toward dimensionally stable mounting modules that enable wet chemical processing chambers, lift-rotate units, and other hardware to be quickly installed or interchanged without having to recalibrate the transport system or other components of the tool. This is expected to reduce the downtime for installing, repairing, or maintaining processing chambers and/or lift-rotate units so that the tool can remain online for long periods of available operating time. Additionally, by reducing the downtime for maintenance, it may be more economical to repair each chamber as needed so that the intermediate processing module and the main processing unit can operate at full capacity.

One embodiment of an intermediate module comprises a dimensionally stable mounting module and a first device attached to the dimensionally stable mounting module. The dimensionally stable mounting module can include a front docking unit with front alignment elements for connecting the mounting module to a load/unload module, and a rear docking unit with rear alignment elements for connecting the mounting module to a main processing unit. The mounting module can further include a deck between the front docking unit and the rear docking unit, positioning elements at the deck, and attachment elements at the deck. The first device can be a processing chamber, an annealing station, a metrology station, a buffer station, or another type of component for holding or otherwise performing a function on a workpiece. The first device has a device interface member engaged with one of the positioning elements and a device fastener engaged with one of the attachment elements so that the first device is positioned precisely at a known location in a fixed reference frame defined by the mounting module.

Another embodiment of an intermediate module for use with a main processing unit comprises a dimensionally stable mounting module, a wet chemical processing chamber carried by the mounting module, and a transport system carried by the mounting module. The mounting module includes a front docking unit having front alignment elements at predetermined locations, a platform extending laterally along the front docking unit, a process section having a deck behind the platform, positioning elements at the platform and the deck, and attachment elements at the platform and the deck. The wet chemical processing chamber is attached to the deck. The wet chemical processing chamber includes chamber interface members engaged with corresponding positioning elements at the deck and chamber fasteners engaged with corresponding attachment elements at the deck. The transport system includes a track attached to the platform and a robot that translates linearly along the track. The track extends in a width-wise direction relative to the mounting module, and the track includes track interface members engaged with corresponding positioning elements at the platform and track fasteners engaged with corresponding attachment elements at the platform. The mounting module is configured to maintain relative positions between the front alignment elements and the positioning elements in a fixed reference frame such that the intermediate module can be attached directly to a load/unload module and a main processing unit without having to manually teach a robot in the intermediate module and/or a robot in the main processing unit the specific locations of chambers and other components.

BRIEF DESCRIPTION OF THE DRAWINGS

FIG. 5A is a rear isometric view of a door assembly for use with an integrated tool assembly in accordance with an embodiment of the invention.

FIG. 5B is a front isometric view of the door assembly shown in FIG. 5A.

DETAILED DESCRIPTION

As used herein, the terms "microfeature workpiece" or "workpiece" refer to substrates on and/or in which microelectronic devices are integrally formed. Typical microdevices include microelectronic circuits or components, thin-film recording heads, data storage elements, micro-fluidic devices, and other products. Micromachines or micromechanical devices are included within this definition because they are manufactured using much of the same technology that is used in the fabrication of integrated circuits. The substrates can be semiconductive pieces (e.g., doped silicon wafers or gallium arsenide wafers), dielectric pieces (e.g., various ceramic substrates), or conductive pieces.

Several embodiments of intermediate mounting modules and integrated tool assemblies for wet chemical processing of microfeature workpieces are described herein in the context of depositing metals or electrophoretic resist in and/or on structures of a workpiece. The intermediate modules and tools in accordance with the invention, however, can be used for other wet chemical processes (etching, rinsing, cleaning or other types of surface preparation processes) or other types of processes (e.g., annealing or metrology) in the fabrication of microfeatures in and/or on semiconductor substrates or other types of workpieces. Several embodiments of tools in accordance with the invention are set forth in FIGS. 1-15, and the following text provides a thorough understanding of particular embodiments of the invention. A person skilled in the art will accordingly understand that the invention may have additional embodiments, or that the invention may be practiced without several of the details of the embodiments shown in FIGS. 1-15.

A. Integrated Tool Assemblies with Intermediate Modules

Figure 1:
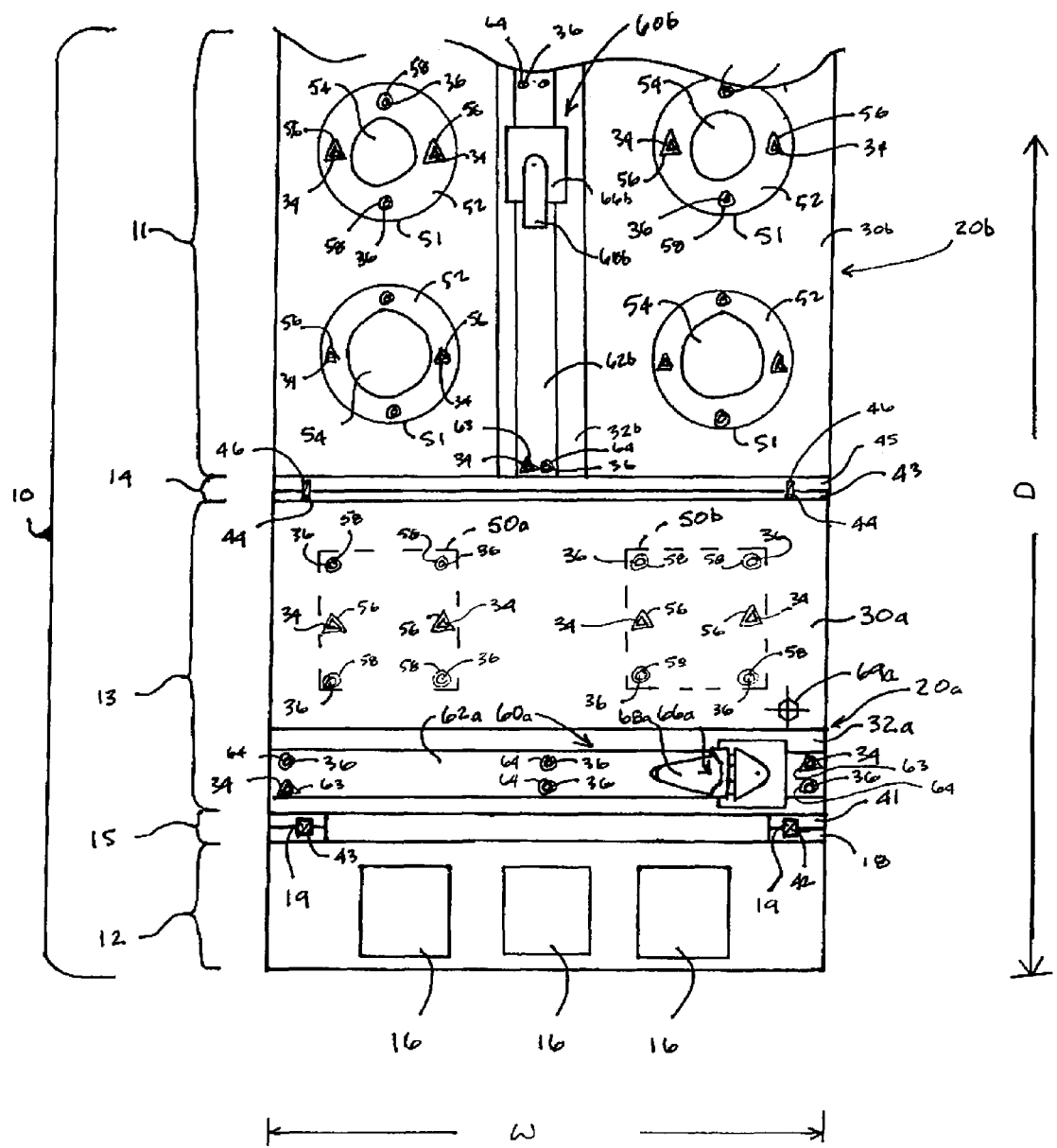
FIG. 1 is a top plan view illustrating an integrated tool assembly with a load/unload module, an intermediate module, and a main processing unit in accordance with an embodiment of the invention. Several features of the integrated tool assembly illustrated in FIG. 1 are shown schematically.

FIG. 1 is a top plan view illustrating an integrated tool assembly 10 in accordance with an embodiment of the invention (several features in FIG. 1 are shown schematically). The embodiment of the integrated tool assembly 10 shown in FIG. 1 includes a main processing unit 11 (only a portion of which is shown in FIG. 1), a load/unload module 12, and an intermediate module 13 between the main processing unit 11 and the load/unload module 12. The main processing unit 11 and the intermediate module 13 have dimensionally stable mounting modules that carry processing components and workpiece transport systems at known locations in a fixed reference frame defined by each mounting module. The intermediate module 13 is fixedly connected to the main processing unit 11 by a first docking assembly 14 that precisely aligns the fixed reference frame of the intermediate module 13 with the fixed reference frame of the main processing unit 11. Similarly, the intermediate module 13 is fixedly connected to the load/unload module 12 by a second docking assembly 15 that accurately aligns the load/unload module 12 with the fixed reference frame of the intermediate module 13.

The dimensionally stable mounting modules of the main processing unit 11 and the intermediate module 13, combined with the precise docking assemblies 14 and 15, enable the intermediate module 13 to be easily installed between the main processing unit 11 and the load/unload module 12. More specifically, a first robot in the intermediate module 13 can operate with components in the load/unload module 12 and a second robot (not shown) in the main processing unit 11 can operate with the intermediate module 13 without manually teaching either robot the positions of the components. Therefore, the integrated tool assembly 10 with the intermediate module 13 provides manufacturers of wet chemical processing tools a significant degree of flexibility in producing customized integrated tool assemblies without having to manufacture customized deck configurations and cabinets for each individual tool.

1. Embodiments of Intermediate Modules

The embodiment of the intermediate module 13 illustrated in FIG. 1 includes a dimensionally stable first mounting module 20a that defines a first fixed reference frame. The first mounting module 20a is a highly rigid structure that can support various processing components and robotic transport systems at known locations in the first fixed reference frame. The intermediate module 13 further includes one or more intermediate stations 50 (identified individually by reference numbers 50a and 50b) attached to the first mounting module 20a at known locations in the first fixed reference frame. The intermediate stations 50a-b can be identical components or different types of components. For example, the first intermediate station 50a can be an annealing station for annealing workpieces after they have been processed in the main processing unit 11. The first intermediate station 50a can alternatively be a metrology station that examines wafers either before or after being processed in the main processing unit 11. The second intermediate station 50b can be a buffer, such as a rack, that holds a plurality of workpieces as they are transferred between the load/unload module 12, the main processing unit 11 and the first intermediate station 50a.

The intermediate module 13 further includes a first transport system 60a fixedly attached to the first mounting module 20a at a known location in the first fixed reference frame. As explained in more detail below, the first mounting module 20a holds the intermediate stations 50a-b and the first transport system 60a at known locations in the first fixed reference frame such that the first transport system 60a can interface with the load/unload module 12 and the intermediate stations 50a-b without manually teaching the first transport system 60a each position of the various components. Additionally, a second transport system 60b of the main processing unit 11 can interface with the intermediate stations 50a-b without having to teach the second transport system 60b the locations of the intermediate stations 50a-b as explained in more detail below.

The first mounting module 20a illustrated in FIG. 1 includes a dimensionally stable first deck 30a and a dimensionally stable first platform 32a. As explained in more detail below, the first deck 30a can be made from a plurality of panels and bracing that form a strong, rigid structure which maintains precise dimensions. The first mounting module 20a further includes a plurality of positioning elements 34 at predetermined locations in the first reference frame of the first mounting module 20a. The first mounting module 20a further includes a plurality of attachment elements 36. In general, the first mounting module 20a has two or more positioning elements 34 and two or more attachment elements 36 at each of the intermediate stations 50a-b on the first deck 30a. The first mounting module 20a also has positioning elements 34 and attachment elements 36 at the first platform 32a that interface with the first transport system 60a. The positioning elements 34 can be precise pins or holes that mate with a corresponding structure of an intermediate station 50 or the first transport system 60a. The attachment elements 36 can be threaded studs or threaded holes to engage a corresponding structure that secures the intermediate stations 50a-b and the first transport system 60a to the first mounting module 20a.

The dimensionally stable first mounting module 20a can further include a front docking unit 41 with front alignment elements 42 and a rear docking unit 43 with rear alignment elements 44. The front docking unit 41 can be a rigid plate fixed to the first platform 32a, and the front alignment elements 42 can be precise pins or holes at predetermined locations in the first fixed reference frame of the first mounting module 20a. Similarly, the rear docking unit 43 can be a rigid plate fixed to the first deck 30a, and the rear alignment elements 44 can be precise pins or holes at predetermined locations in the first fixed reference frame of the first mounting module 20a. As explained in more detail below, the front docking unit 41 aligns the load/unload module 12 with the first fixed reference frame of the intermediate module 13, and the rear docking unit 43 aligns the first fixed reference frame of the intermediate module 13 with a second fixed reference frame of the main processing unit 11. As such, the first and second docking units 41 and 43 accurately position the fixed reference frames of the main processing unit 11, the load/unload module 12, and the intermediate module 13 with respect to each other so that the transport systems in the main processing unit 11 and the intermediate module 13 can operate with the corresponding components in the integrated tool assembly 10 without having to manually teach the robots the locations of the various components.

The intermediate stations 50a-b in the embodiment illustrated in FIG. 1 include interface members 56 and fasteners 58. The interface members 56 are arranged in a pattern to mate with corresponding positioning elements 34 at one of the stations on the first deck 30a. The fit between the positioning elements 34 and the interface members 56 is very tight so that each intermediate station 50 is positioned precisely at a predetermined location with respect to the fixed first reference frame of the first mounting module 20a when the interface members 56 are engaged with corresponding positioning elements 34 on the first deck 30a. Suitable components for the intermediate stations 50a-b are explained in more detail below with reference to FIG. 2.

The first transport system 60a of the intermediate module 13 includes a first track 62a, a plurality of track interface members 63, and track fasteners 64. The track interface members 63 are arranged to engage corresponding positioning elements 34 on the first platform 32a to position the first track 62a at a known location in the fixed first reference frame of the first mounting module 20a. The first track 62a extends laterally along a width-wise direction W relative to the front of the integrated tool assembly 10 as opposed to extending axially along a depth-wise direction D of the integrated tool assembly 10. The first transport system 60a can further include a first robot 66a having a first dual coaxial end-effector assembly 68a. Only one end-effector of the dual coaxial end-effector assembly 68a is shown in FIG. 1 with the understanding that an additional end-effector is superimposed directly beneath the illustrated end-effector. Suitable robots and tracks are disclosed in U.S. Pat. Nos. 6,752,584 and 6,749,390, and U.S. Publication No. 2003/0159921, all of which are herein incorporated by reference in their entirety.

The first transport system 60a can further include a first calibration unit 69a attached to the first deck 30a as shown in FIG. 1, or the first calibration unit 69a can be attached to the first platform 32a. The first calibration unit 69a is fixed at a known location in the first reference frame of the first mounting module 20a. The first calibration unit 69a automatically determines the position of the first robot 66a and end-effector assembly 68a relative to the fixed first reference frame of the first mounting module 20a. The first calibration unit 69a also corrects any misalignment of the first robot 66a and end-effector assembly 68a so that the first transport system 60a can accurately interface with the workpiece holders 16 and the intermediate stations 50a-b without having to manually teach the first robot 66a the location of each of these components in the integrated tool assembly 10. Suitable calibration units and calibration methods for use with the intermediate module 13 are disclosed in U.S. patent application Ser. No. 10/860,385 (now U.S. Pat. No. 7,313,462) and Ser. No.

10/861,240 now U.S. Pat. No. 7,198,694, which applications are both incorporated by reference herein in their entirety.

2. Main Processing Units

Referring still to FIG. 1, the main processing unit 11 can include a dimensionally stable second mounting module 20b having a second deck 30b and a second platform 32b. The second mounting module 20b is similar to the first mounting module 20a of the intermediate module 13, and thus the second mounting module 20b defines a second fixed reference frame. The second mounting module 20b further includes positioning elements 34 and attachment elements 36 on the second deck 30b and the second platform 32b. The positioning elements 34 are located precisely at predetermined locations in the second fixed reference frame of the second mounting module 20b.

The main processing unit 11 can further include a plurality of processing chambers 51 having a flange 52 and a vessel 54 attached to the flange 52. The flange 52 is a dimensionally stable component that includes interface members 56 at predetermined locations relative to the vessel 54 and fasteners 58. The interface members 56 are arranged in a pattern to mate with corresponding positioning elements 34 at a corresponding processing station on the second deck 30b. The fit between the positioning elements 34 and the interface members 56 is very tight so that each vessel 54 is positioned precisely at a predetermined location with respect to the second fixed reference frame of the second mounting module 20b when the interface members 56 are engaged with corresponding positioning elements 34 on the second deck 30b. Suitable wet chemical processing chambers are described in more detail below with reference to specific embodiments of the main processing unit 11.

The main processing unit 11 can further include the second transport system 60b having a second track 62b and a second robot 66b carried by the second track 62b. The second robot 66b can further include a second end-effector assembly 68b (shown schematically). The second end-effector assembly 68b can be substantially the same as the first end-effector assembly 68a of the intermediate module 13. The second track 62b includes track interface members 63 engaged with positioning elements 34 on the second platform 32b to position the second track 62b at a known location and orientation with respect to the second fixed reference frame of the second mounting module 20b. The second track 62b can further include fasteners 64 engaged with attachment elements 36 on the second platform 32b to fix the second track 62b to the second mounting module 20b.

The main processing unit 11 can further include a docking unit 45 with alignment elements 46. The docking unit 45 is typically a rigid panel attached to the second mounting module 20b such that the alignment elements 46 are at predetermined locations in the second fixed reference frame of the second mounting module 20b. The docking unit 45 is coupled to the rear docking unit 43 of the intermediate module 13 so that the alignment elements 46 are engaged with the rear alignment elements 44. The interface between the rear alignment elements 44 and the alignment elements 46 registers the first fixed reference frame of the first mounting module 20a with the second fixed reference frame of the second mounting module 20b. As such, the intermediate stations 50a-b are at known locations within the second fixed reference frame of the main processing unit 11 so that the second robot 66b can interface with the first and second intermediate stations 50a-b without having to manually teach the second robot 66b the locations of these components.

3. Load/Unload Modules

The load/unload module 12 illustrated in FIG. 1 includes the workpiece holders 16 that hold cassettes or pods with wafers. The workpiece holders 16 are typically arranged so that specific workpiece holders 16 carry pods having either unfinished workpieces that have not been processed through the main processing unit 11 or finished workpieces that have been processed through the main processing unit 11. The load/unload module 12 further includes a docking unit 18 and alignment elements 19. The docking unit 18 can be a rigid plate or panel, and the alignment elements 19 can be pins or holes that mate with the front alignment elements 42 of the first mounting module 20a. In operation, the docking unit 18 is attached to the front docking unit 41 of the first mounting module 20a so that the alignment elements 19 are engaged with the front alignment elements 42. The interface between the alignment elements 19 and the front alignment elements 42 precisely locates the workpiece holders 16 at predetermined locations in the first fixed reference frame of the first mounting module 20a. As such, the first robot 66a can accurately move the end-effectors in and out of cassettes or pods on the workpiece holders 16 without having to manually teach the first robot 66a the specific locations of the workpiece holders 16.

4. Operating Integrated Tool Assemblies

The integrated tool assembly 10 illustrated in FIG. 1 with the intermediate module 13 between the main processing unit 11 and the load/unload module 12 provides several benefits. For example, the intermediate module 13 can be added to an existing main processing unit to augment the capacity and increase the throughput of finished wafers compared to an integrated tool without the intermediate module 13. One suitable intermediate module 13 that can achieve this benefit has a processing chamber for the first intermediate station 50a and a buffer for the second intermediate station 50b. The processing chamber at the first intermediate station 50a increases the capacity by adding another processing chamber to the integrated tool assembly 10. The buffer at the second intermediate station 50b increases the throughput because the second robot 66b in the main processing unit 11 need only service the processing chambers 51 while the first robot 66a handles workpieces with the load/unload module 12.

The intermediate module 13 can also be used to add functionality to a main processing unit. For example, the first intermediate station 50a can be an annealing station or metrology unit and the second intermediate station 50b can be a buffer rack. This type of an intermediate module 13 adds the functionality of annealing and/or examining workpieces to a main processing unit with only wet chemical chambers. Additionally, this type of intermediate module 13 also enhances the throughput because the first robot 66a and second robot 66b can simultaneously handle workpieces in different areas of the integrated tool assembly 10.

The intermediate module 13 is also expected to enhance the efficiency and reduce the cost of manufacturing wet chemical processing tools. The intermediate module 13 can have a common first mounting module 20a to which several different components can be attached depending upon the particular application for the integrated tool assembly 10. This enables manufacturers of wet chemical processing tools to produce many different types of integrated tool assemblies 10 with different configurations of components using a single type of first mounting module 20a and a single type of second mounting module 20b. Therefore, manufacturers of wet chemical processing tools can more efficiently produce custom tool assemblies to meet the particular needs of individual customers without having to produce or maintain inventories of unique platforms.

B. Specific Embodiments of Intermediate Modules and Load/Unload Modules

Figure 2:
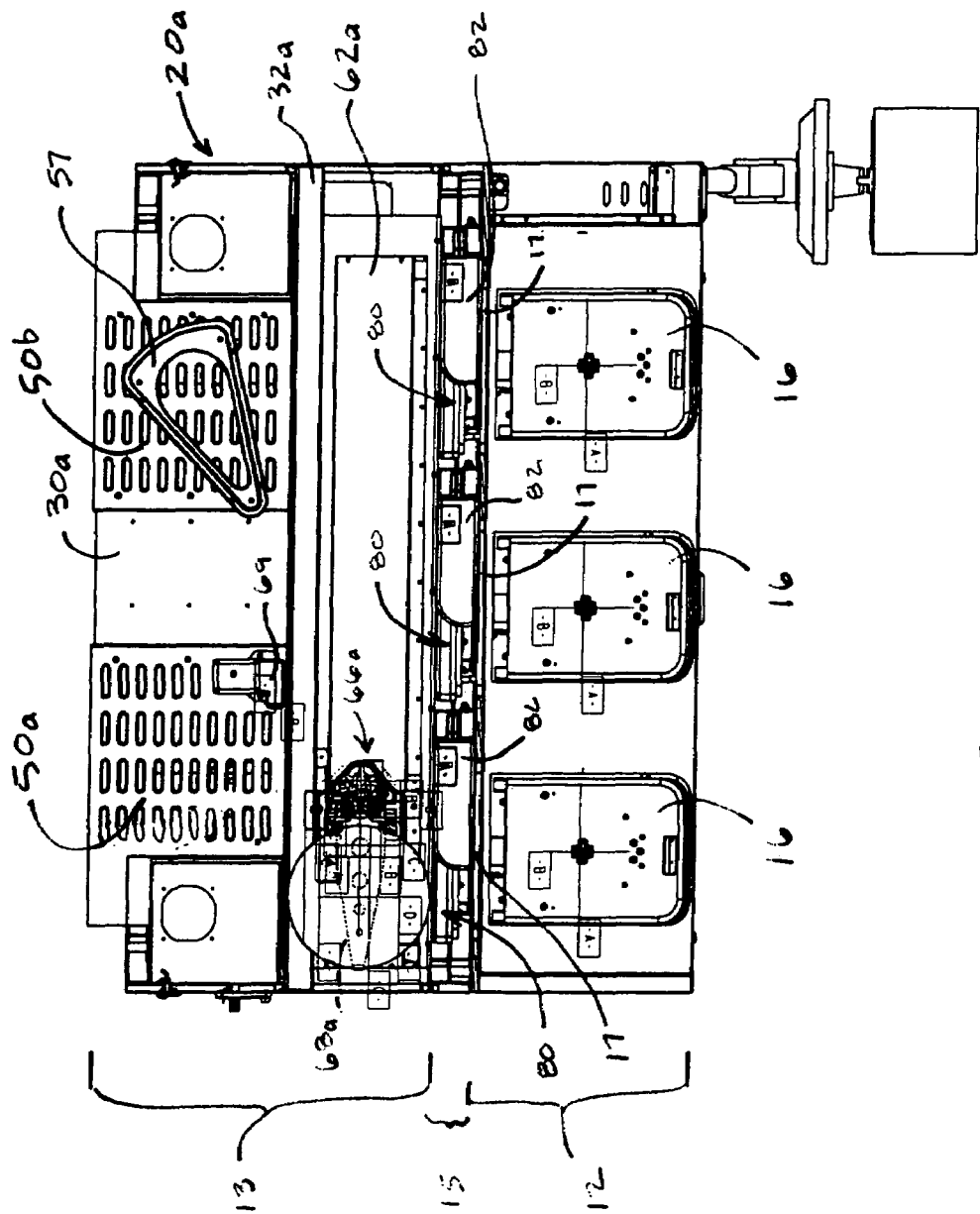
FIG. 2 is a top plan view of an embodiment of a load/unload module and an intermediate module in accordance with a specific embodiment of the invention.

FIG. 2 is a top plan view of the load/unload module 12 and the intermediate module 13 in accordance with a specific embodiment of the invention. The load/unload module 12 in this embodiment includes three workpiece holders 16 that are serviced by the first robot 66a. The three workpiece holders 16 move between a lowered position at which a person can load/unload pods onto the workpiece holders 16, and a raised position in which the workpiece holders 16 locate the pods at raised windows 17 between the load/unload module 12 and the intermediate module 13. The docking assembly 15 between the load/unload module 12 and the intermediate module 13 can include a plurality of door assemblies 80 that open and close the windows 17 in the load/unload module 12. The door assemblies 80 can further include scanners 82 that detect the locations of individual workpieces in pods on the workpiece holders 16.

The intermediate module 13 includes the first mounting module 20a with the first deck 30a and the first platform 32a. In this embodiment, the first robot 66a includes dual coaxial end-effectors 68 (only one shown). Suitable dual coaxial end-effectors are disclosed and described in U.S. Pat. Nos. 6,752,584 and 6,749,390, and U.S. Application No. 60/586,514, entitled Transfer Devices And Methods For Handling Microfeature Workpieces Within An Environment Of A Processing Machine, filed on Jul. 9, 2004. In this embodiment, the first intermediate station 50a is vacant and ready to receive an annealing station, a metrology station, or other type of station for use with workpieces before, during and/or after processing the workpieces through the processing chambers 51 of the main processing unit 11. The second intermediate station 50b can include a buffer 57 that holds wafers as they are transferred between the load/unload module 12, the main processing unit 11, and the first intermediate station 50a. The buffer 57 can be a rack having a plurality of different slots for holding individual workpieces.

Figure 3:
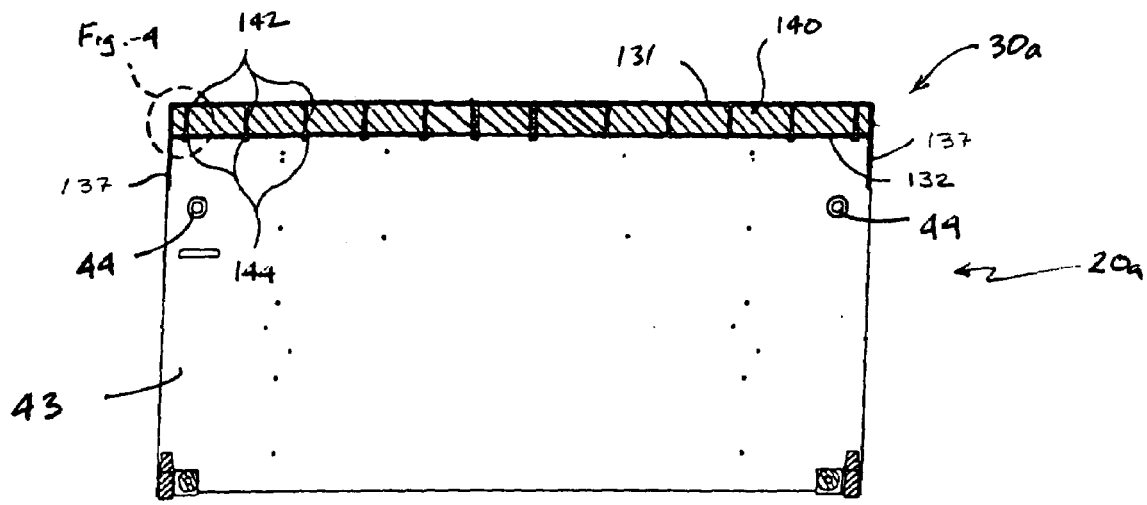
FIG. 3 is a cross-sectional view illustrating an embodiment of a mounting module for the intermediate module in accordance with an embodiment of the invention.
Figure 4:
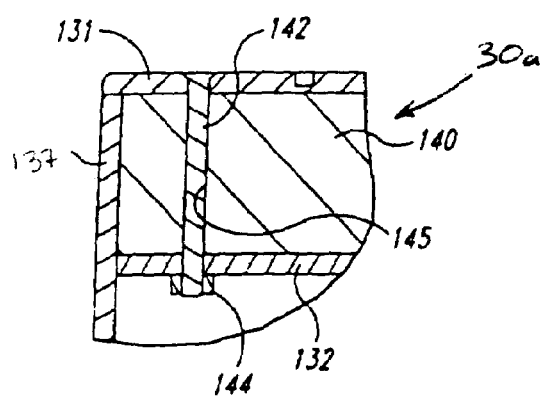
FIG. 4 is a detailed view of a portion of the mounting module illustrated in FIG. 3.

FIG. 3 is a cross-sectional view illustrating one suitable embodiment of the internal structure of the first deck 30a, and FIG. 4 is a detailed view of a portion of the deck shown in FIG. 3. In this embodiment, the first deck 30a includes a first panel 131, a second panel 132 juxtaposed to the first panel 131, and side members 137. The first deck 30a further includes bracing 140, such as joists, extending laterally between the exterior side members 137. The first panel 131 is attached to the upper side of the bracing 140, and the second panel 132 is attached to the lower side of the bracing 140. The first deck 30a can further include a plurality of through bolts 142 and nuts 144 that secure the first and second panels 131 and 132 to the bracing 140. As best shown in FIG. 4, the bracing 140 has holes 145 which receive the through bolts 142. The nuts 144 can be welded to the bolts 142 to enhance the connection between these components.

FIG. 3 further illustrates the rear docking unit 43 of the first mounting module 20a. In this embodiment, the rear docking unit 43 is a stainless steel plate that is welded or otherwise rigidly attached to the side members 137, and/or the first and second panels 131 and 132. The rear alignment elements 44 in this embodiment are precisely machined holes configured to receive pin-like alignment elements 46 projecting from the docking unit 45 of the first processing unit 11 (FIG. 1).

The panels, plates and bracing of the first deck 30a can be made from stainless steel, other metal alloys, solid cast materials, or fiber-reinforced composites. For example, the panels 131 and 132 and side members 137 can be made from Nitronic 50 stainless steel, Hastelloy 625 steel alloys, or a solid cast epoxy filled with mica. The fiber-reinforced composites can include a carbon-fiber or a Kevlar® mesh in a hardened resin. The materials for the panels should be highly rigid and compatible with the chemicals used in the wet chemical processes. Stainless steel is well suited for many applications because it is strong, but not affected by many of the electrolytic solutions or cleaning solutions used in wet chemical processes. In one embodiment, the panels, plates and bracing 131, 132, 137, 140 and 43 are 0.125 to 0.375 inch thick stainless steel, and more specifically they can be 0.250 inch thick stainless steel. In other embodiments, the bracing 140 can be a honey-comb core or other structures made from metals, polymers, fiberglass or other materials.

The first mounting module 20a is constructed by assembling the sections of the first deck 30a, and then welding or otherwise adhering the rear docking unit 43 and the front docking unit 41 (shown schematically in FIG. 1). The components of the first deck 30a are generally secured together by the through bolts 142 without welds. The side members 137 and the docking units 41 and 43 are attached to the deck using welds and/or fasteners. The first platform 32a is then securely attached to the side members 137. The order in which the components of the first mounting module 20a are assembled can have several different embodiments and is not limited to the procedure explained above.

The first mounting module 20a provides a heavy-duty, dimensionally stable structure that maintains the relative positions between the positioning elements 34 on the first deck 30a and the positioning elements 34 on the first platform 32a in a range that does not require the first transport system 60a to be recalibrated or otherwise manually taught the location of the workpiece holders 16 of the load/unload module 12 (FIG. 2) or the first and second intermediate stations 50a-b (FIG. 2). The first mounting module 20a is generally a rigid structure that is sufficiently strong to maintain the relative positions between the positioning elements 34 when the first and second intermediate stations 50a-b are mounted to the first deck 30a and the first transport system 60a is mounted to the first platform 32a. In several embodiments, the first mounting module 20a is configured to maintain the relative positions between the positioning elements 34 to within 0.025 inch. In other embodiments, the first mounting module 20a is configured to maintain the relative positions between the positioning elements 34 to within approximately 0.005 to 0.015 inch. As such, the first deck 30a often maintains a uniformly flat surface to within approximately 0.025 inch, and in more specific embodiments to approximately 0.005-0.015 inch.

FIG. 5A is a rear isometric view and FIG. 5B is a front isometric view of a door assembly 80 in accordance with an embodiment of the invention. The door assembly 80 includes a scanner 82, a guide track 83, and a door panel 84 that moves relative to the guide track 83. The guide track 83 is fixed to the load/unload module 12 (FIG. 1). The door assembly further includes a carriage 85 slidably attached to the guide track 83, and an actuator assembly 90 attached to the carriage 85. The actuator assembly 90 includes a motor (not shown) that moves the door panel 84 vertically with respect to the carriage 85. The actuator assembly 90 further includes a cam follower 92 having an angled slot 94 and a cam 96 received within the slot 94. The motor moves the cam follower 92 and the door panel 84 so that the cam follower 92 rides along the cam 96.

The door assembly 80 operates to raise/lower the door panel 84 and move the door panel 84 laterally in a depth-wise direction "d" with respect to the guide track 83. More specifically, the carriage 85 moves vertically (arrow $M_1$) along the guide track 83 until the door panel 84 is raised to approximately the level of the window 17 (FIG. 2). At this point, the actuator assembly 90 raises the cam follower 92 and the door panel 84 such that the cam 96 moves the door panel 84 laterally along a second movement (arrow $M_2$) and then a third movement (arrow $M_3$). The slot 94 in the cam follower 92 is configured with two different segments at different angles to drive the door panel 84 along the second movement $M_2$ and the third movement $M_3$.

The door assembly 80 illustrated in FIGS. 5A and 5B opens and closes the door panel 84 in a limited lateral stroke. As such, the door assembly 80 only requires a slight depth "d" to operate between opened and closed positions. This is advantageous because it reduces the overall depth D of the integrated tool assembly (FIG. 1). For example, the illustrated door assembly 80 reduces the overall depth D of the integrated tool assembly by approximately five inches.

The door assembly 80 illustrated in FIGS. 5A and 5B works particularly well with pods that carry workpieces in clean mini-environments. In this application, the door assembly 80 moves the door panel 84 through movements $M_1$, $M_2$, and $M_3$ to position the door panel 84 in an access opening (not shown) through a wall (not shown) between the intermediate module 13 (FIG. 1) and the load/unload module 12 (FIG. 1). A pod (not shown) is then positioned at the access opening so that the perimeter of the pod is sealed against the wall and a pod door (not shown) is engaged with the door panel 84. The door assembly 80 then reverses the motion to open the pod to the interior of the intermediate module 13. More specifically, as the door panel 84 moves downward through movement $M_3$, the door panel 84 removes the pod door from the pod. Further, as the door panel 84 moves through the movements $M_2$ and $M_1$, the door panel 84 moves the pod door into an interior pocket (not shown) to protect the pod door. The door assembly 80 and the pod accordingly operate to maintain the environments in the intermediate module 13 and the pod at clean standards. As example of a pod for 300 mm workpieces and the interface between such pods and similar door assemblies are described in U.S. Pat. No. 6,717,171 incorporated by reference above.

C. Specific Embodiments of Main Processing Units

Figure 6A:
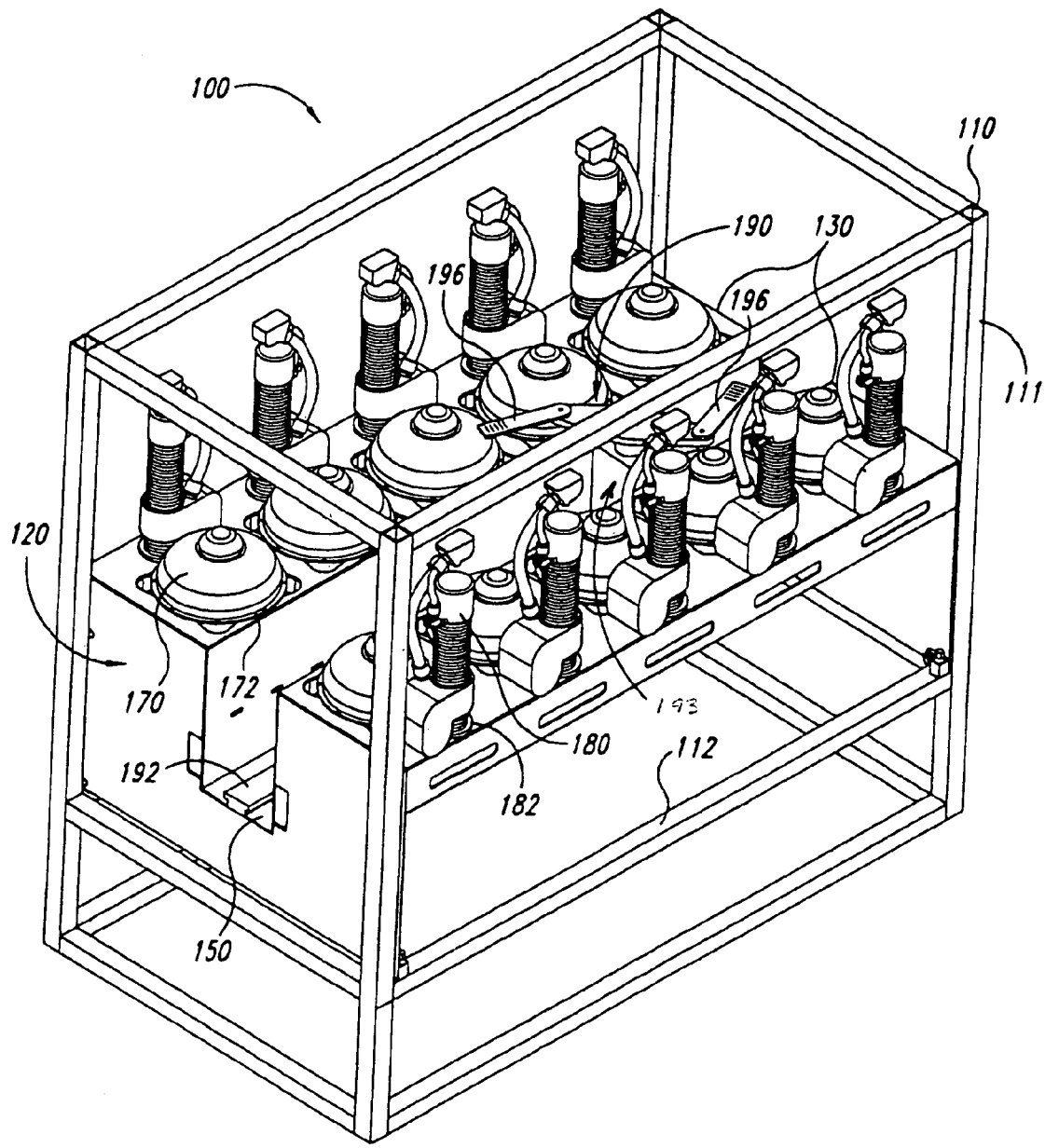
FIG. 6A is an isometric view of a main processing unit for use with the integrated tool assembly in accordance with a specific embodiment of the invention.

FIGS. 6A-12 illustrate an embodiment of a main processing unit 100 that can be used for the main processing unit 11 in the integrated tool assembly 10 described above with reference to FIG. 1. FIG. 6A, more specifically, is an isometric view showing a portion of the main processing unit 100. In this embodiment, the main processing unit 100 includes a frame 110, a dimensionally stable second mounting module 120 mounted to the frame 110, a plurality of wet chemical processing chambers 170, and a plurality of lift-rotate units 180. The main processing unit 100 can also include a second transport system 190. The second mounting module 120 carries the processing chambers 170, the lift-rotate units 180, and the second transport system 190.

The frame 110 has a plurality of posts 111 and cross-bars 112 that are welded together in a manner known in the art. A plurality of outer panels and doors (not shown in FIG. 6A) are generally attached to the frame 110 to form an enclosed cabinet. The second mounting module 120 is at least partially housed within the frame 110. In one embodiment, the second mounting module 120 is carried by the cross-bars 112 of the frame 110, but the second mounting module 120 can stand directly on the floor of the facility or other structures in other embodiments.

The second mounting module 120 is a rigid, stable structure that maintains the relative positions between the wet chemical processing chambers 170, the lift-rotate units 180, and the second transport system 190. One aspect of the second mounting module 120 is that it is much more rigid and has a significantly greater structural integrity compared to the frame 110 so that the relative positions between the wet chemical processing chambers 170, the lift-rotate units 180, and the second transport system 190 do not change over time. Another aspect of the second mounting module 120 is that it includes a dimensionally stable second deck 130 with positioning elements at precise locations for positioning the processing chambers 170 and the lift-rotate units 180 at known locations on the second deck 130. In one embodiment (not shown), the second transport system 190 can be mounted directly to the second deck 130. In other embodiments, the second mounting module 120 also has a dimensionally stable second platform 150 and the second transport system 190 is mounted to the second platform 150. The second deck 130 and the second platform 150 are fixedly positioned relative to each other so that positioning elements on the second deck 130 and positioning elements on the second platform 150 do not move relative to each other. The second mounting module 120 accordingly provides a system in which wet chemical processing chambers 170 and lift-rotate units 180 can be removed and replaced with interchangeable components in a manner that accurately positions the replacement components at precise locations on the second deck 130.

The main processing unit 100 is particularly suitable for applications that have demanding specifications which require frequent maintenance of the wet chemical processing chambers 170, the lift-rotate units 180, or the second transport system 190. A wet chemical processing chamber 170 can be repaired or maintained by simply detaching the chamber from the processing second deck 130 and replacing the chamber 170 with an interchangeable chamber having mounting hardware configured to interface with the positioning elements on the second deck 130. Because the second mounting module 120 is dimensionally stable and the mounting hardware of the replacement processing chamber 170 interfaces with the second deck 130, the chambers 170 can be interchanged on the second deck 130 without having to recalibrate the second transport system 190. This is expected to significantly reduce the downtime associated with repairing or maintaining processing chambers 170 so that the tool can maintain a high throughput in applications that have stringent performance specifications.

Figure 6B:
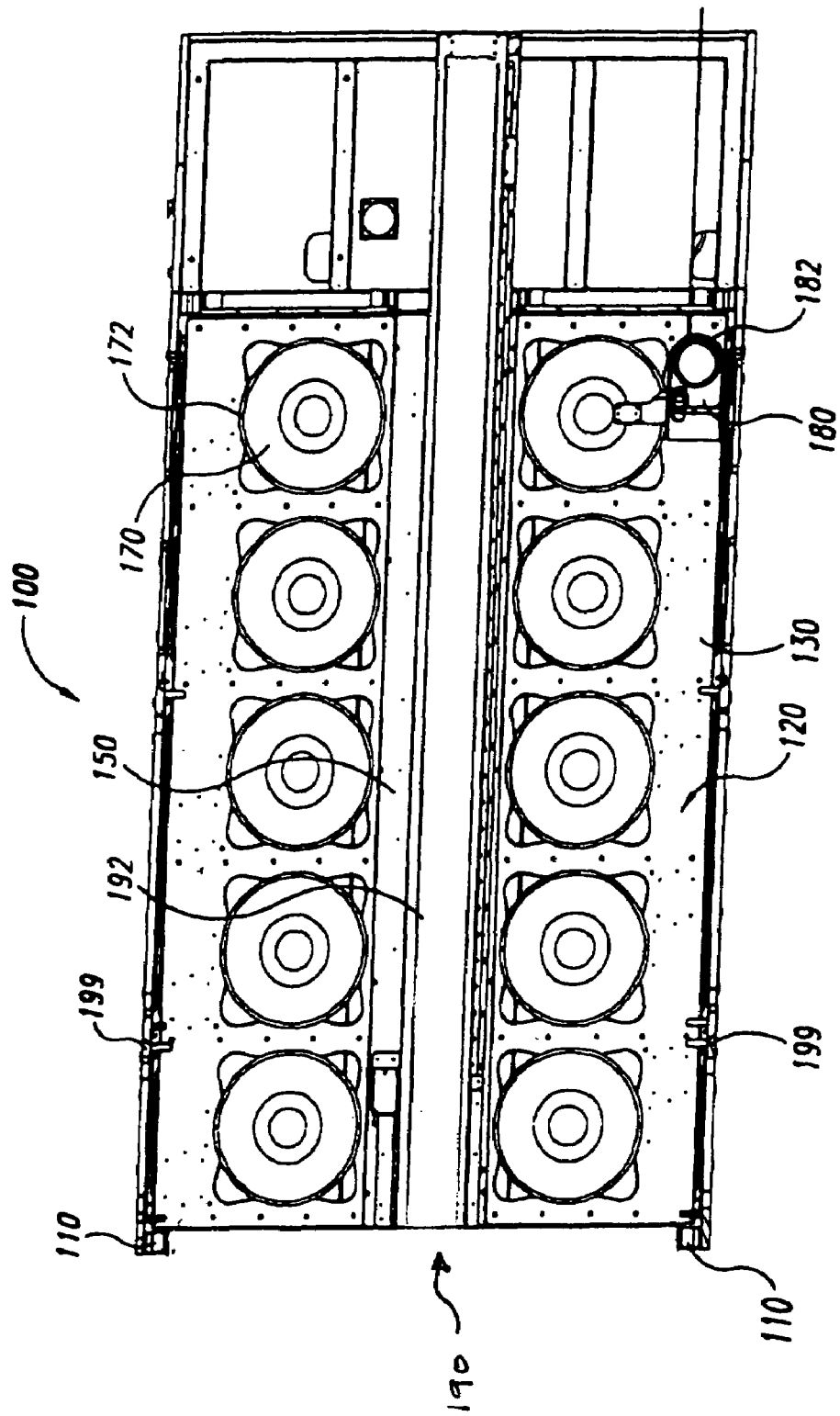
FIG. 6B is a top plan view of the main processing unit shown in FIG. 6A.

FIG. 6B is a top plan view of the main processing unit 100. Referring to FIGS. 6A and 6B together, the second transport system 190 includes a second track 192 and a second robot 193 (FIG. 6A). The second track 192 is mounted to the second platform 150 in the embodiment shown in FIGS. 6A and 6B. More specifically, the second track 192 interfaces with positioning elements on the second platform 150 to accurately position the second track 192 relative to the chambers 170 and the lift-rotate units 180 attached to the second deck 130. The second robot 193 moves linearly along the second track 192, and the second robot 193 includes an arm assembly and end-effectors 196 rotatably carried by the arm assembly. The arm assembly rotates and moves along an elevation axis to position the end-effectors 196 at the chambers 170 and cassettes in the load/unload module. The second robot 193 and end-effectors 196 can accordingly move in a fixed, dimensionally stable reference frame established by the second mounting module 120. Referring to FIG. 6B, the main processing unit 100 can further include a plurality of panels 199 attached to the frame 110 to enclose the second mounting module 120, the wet chemical processing chambers 170, the lift-rotate units 180, and the second transport system 190 in a cabinet. In other embodiments, the panels 199 on one or both sides of the main processing unit 100 can be removed.

1. Embodiments of Dimensionally Stable Mounting Modules

Figure 7:
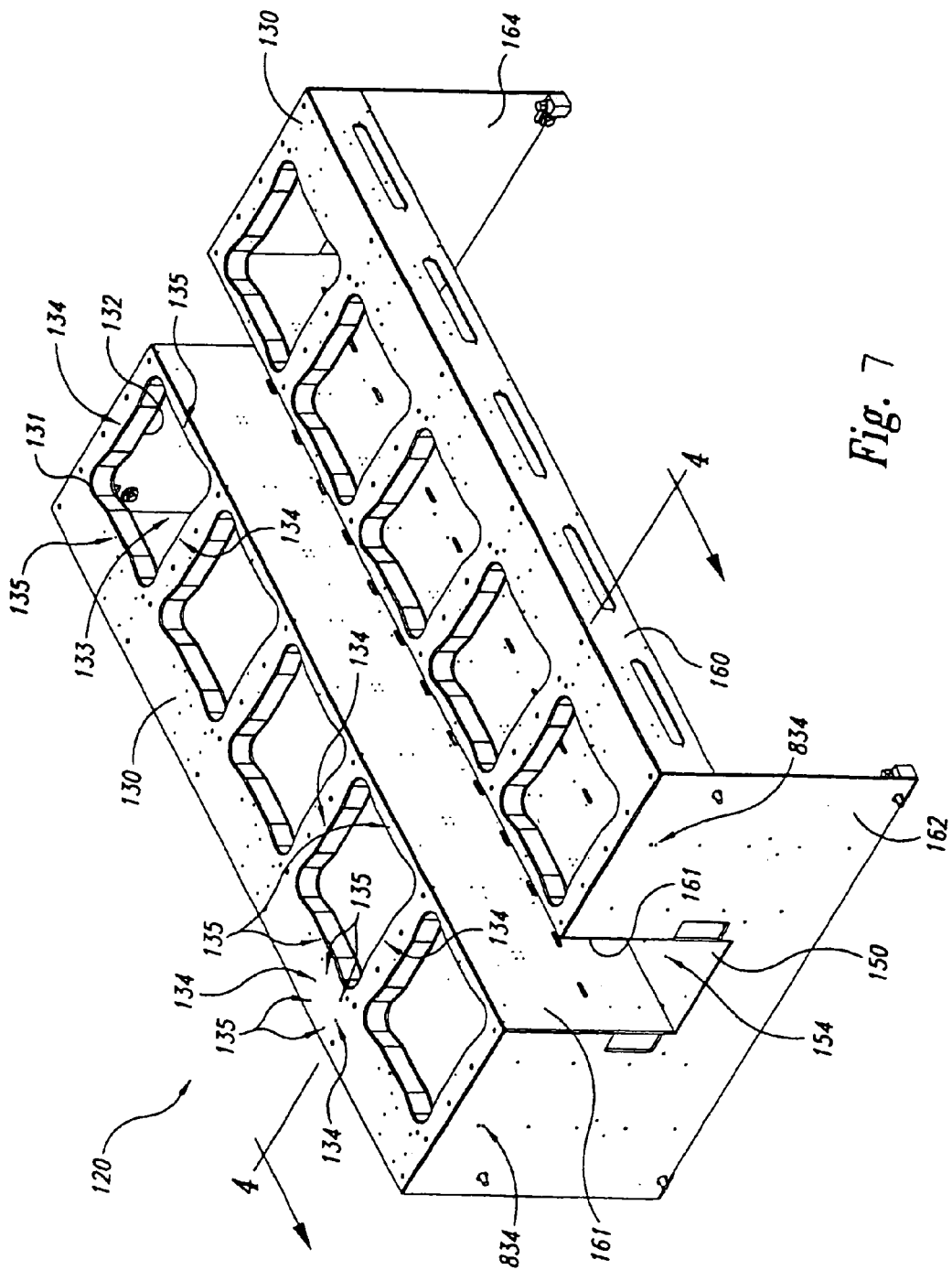
FIG. 7 is an isometric view of a mounting module for use in the main processing unit in accordance with an embodiment of the invention.

FIG. 7 is an isometric view of the second mounting module 120, which is similar to the embodiment of the first mounting module 20a shown in FIG. 3. Like reference numbers accordingly refer to similar components in these figures. In this embodiment, the second deck 130 includes a rigid first panel 131 and a rigid second panel 132 superimposed underneath the first panel 131. The first panel 131 can be an outer member and the second panel 132 can be an interior member juxtaposed to the outer member, but the first and second panels 131 and 132 can also have different configurations. A plurality of chamber receptacles 133 are disposed in the first and second panels 131 and 132 to receive the wet chemical processing chambers 170 (FIG. 6A).

The second deck 130 can further include a plurality of positioning elements 134 and attachment elements 135 arranged in a precise pattern across the first panel 131. The positioning elements 134 can be holes machined in the first panel 131 at precise locations and/or dowels or pins received in the holes. The dowels are also configured to interface with the wet chemical processing chambers 170 (FIG. 6A). In other embodiments, the positioning elements 134 can be pins, such as cylindrical pins or conical pins, that project upwardly from the first panel 131 without being positioned in holes in the first panel 131. The second deck 130 has a first set of positioning elements 134 located at each chamber receptacle 133 to accurately position the individual wet chemical processing chambers at precise locations on the second mounting module 120. The second deck 130 can also include a second set of positioning elements 134 near each receptacle 133 to accurately position individual lift-rotate units 180 at precise locations on the second mounting module 120. The attachment elements 135 can be threaded holes in the first panel 131 that receive bolts to secure the chambers 170 and the lift-rotate units 180 to the second deck 130.

The second mounting module 120 also includes exterior side plates 160 along longitudinal outer edges of the second deck 130, interior side plates 161 along longitudinal inner edges of the second deck 130, and endplates 162 and 164 attached to the ends of the second deck 130. The endplate 162 can be the docking unit 45 described above with reference to FIG. 1. The second platform 150 is attached to the interior side plates 161 and the endplates 162 and 164. The second platform 150 includes positioning elements 152 for accurately positioning the second track 192 (FIGS. 6A and 6B) of the second transport system 190 on the second mounting module 120. The second platform 150 can further include attachment elements, such as tapped holes, that receive bolts to secure the second track 192 to the second platform 150.

Figure 8:
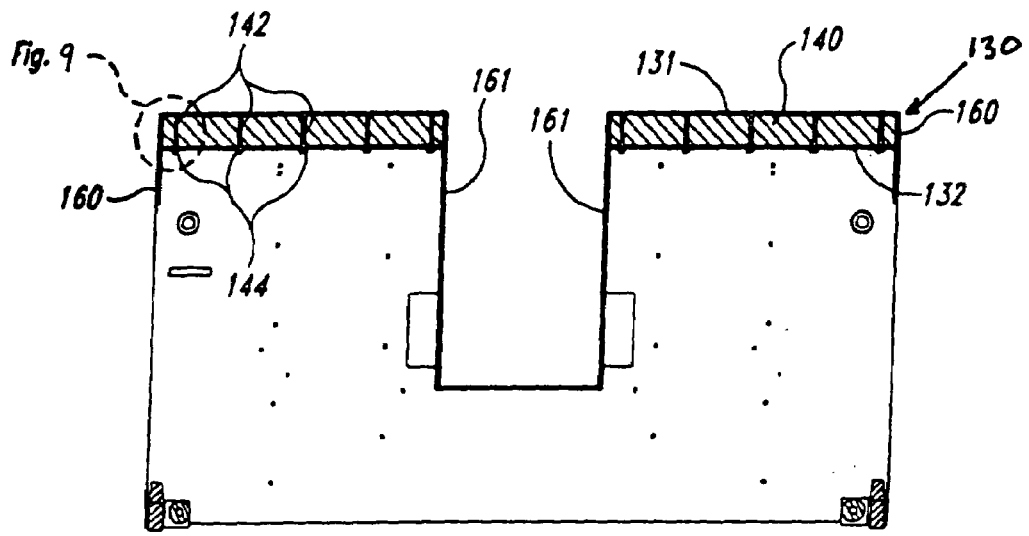
FIG. 8 is a cross-sectional view illustrating a portion of a mounting module for use in the main processing unit of the integrated tool assembly in accordance with an embodiment of the invention.
Figure 9:
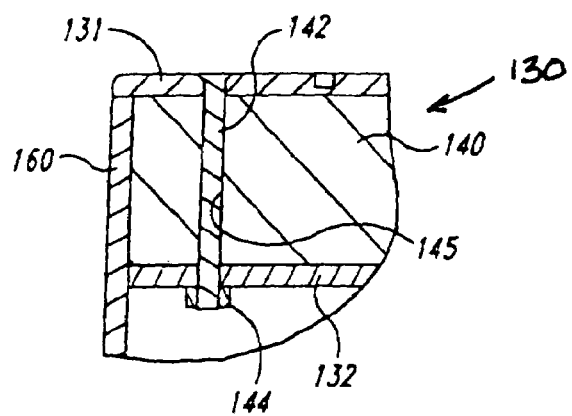
FIG. 9 is a detailed view of a portion of the mounting module illustrated in FIG. 8.

FIG. 8 is a cross-sectional view illustrating one suitable embodiment of the internal structure of the second deck 130, and FIG. 9 is a detailed view of a portion of the deck shown in FIG. 8. In this embodiment, the second deck 130 includes bracing 140 extending laterally between the exterior side plates 160 and the interior side plates 161. The first panel 131 is attached to the upper side of the bracing 140, and the second panel 132 is attached to the lower side of the bracing 140. The second deck 130 can further include a plurality of through bolts 142 and nuts 144 that secure the first and second panels 131 and 132 to the bracing 140. As best shown in FIG. 9, the bracing 140 has a plurality of holes 145 which receive the through bolts 142. The panels and bracing of the second deck 130 can be made from the same materials set forth above with respect to the first deck 30a. The second mounting module 120 also provides a dimensionally stable, heavy-duty structure that maintains the relative positions between positioning elements within the tolerances described above with reference to the first mounting module 20a.

2. Embodiments of Wet Chemical Processing Chambers

Figure 10:
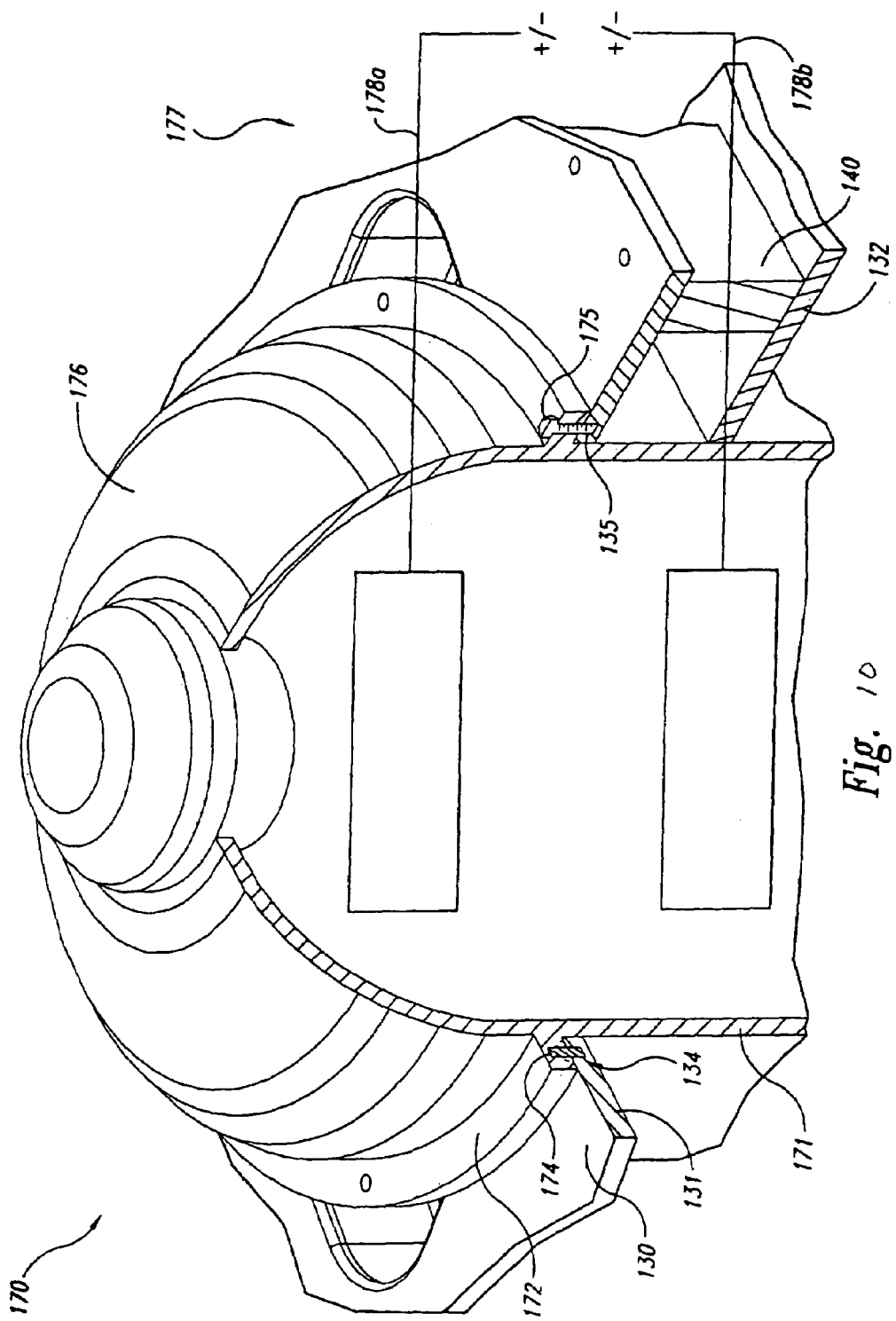
FIG. 10 is an isometric view with a cut-away portion illustrating a processing chamber mounted to a mounting module of a main processing unit in accordance with an embodiment of the invention.

FIG. 10 is an isometric cross-sectional view showing the interface between a wet chemical processing chamber 170 and the second deck 130. The chamber 170 can include a processing vessel 171 and a collar 172. The processing vessel 171 can be formed from a polymeric material or other material that is compatible with the chemicals used in the wet chemical process. In many applications, the processing vessel 171 is composed of a high density polymer that does not react with the electrolytic solution, cleaning solution, or other type of fluids used in the chamber 170. The collar 172 and the vessel 171 can be separate components that are connected together. In such cases, the collar 172 can be made from a dimensionally stable material, such as stainless steel, fiber-reinforced materials, steel alloys, cast solid materials, or other suitably rigid materials. In other embodiments, the collar 172 is integral with the vessel 171 and formed from a high-density polymer or other suitable material.

The collar 172 includes a plurality of interface members 174 that are arranged in a pattern to be aligned with the positioning elements 134 on the second deck 130. The positioning elements 134 and the interface members 174 are also configured to mate with one another to precisely position the collar 172, and thus the chamber 170, at a desired operating location on the second deck 130 to work with lift-rotate unit 180 and the second transport system 190. The positioning elements 134 can be a set of precisely machined holes in the second deck 130 and dowels received in the holes, and the interface members 174 can be holes precisely machined in the collar 172 to mate with the dowels. The dowels can be pins with cylindrical, spherical, conical or other suitable shapes to align and position the collar 172 at a precise location relative to the second deck 130. The collar 172 can further include a plurality of fasteners 175 arranged to be aligned with the attachment elements 135 in the second deck 130. The fasteners 175 can be bolts or other threaded members that securely engage the attachment elements 135 to secure the collar 172 to the second deck 130. The collar 172 accordingly holds the processing vessel 171 at a fixed, precise location on the deck.

The wet chemical processing chambers 170 can be electrochemical deposition chambers, spin-rinse-dry chambers, cleaning capsules, etching chambers, or other suitable wet chemical processing stations. The chamber 170 illustrated in FIG. 10 is an electrochemical deposition chamber having a head 176 with a workpiece holder to position a workpiece in the vessel 171. The chamber 170 shown in FIG. 10 also has an electrical system 177 having a first electrode 178a configured to contact the workpiece and a second electrode 178b disposed in the vessel 171. The first and second electrodes 178a and 178b establish an electrical field to plate ions in an electrolytic solution onto the workpiece. It will be appreciated that the electrochemical processing chamber 170 can be an electroless chamber that does not include the electrical system 177. Suitable electrochemical deposition chambers are disclosed in (a) U.S. Pat. Nos. 6,569,297 and 6,660,137; (b) U.S. Publication Nos. 2003/0068837; 2003/0079989; 2003/0057093; 2003/0070918; 2002/0032499; 2002/0139678; 2002/0125141; 2001/0032788; 2003/0127337; and 2004/0013808; and (c) U.S. application Ser. No. 10/861,899, all of which are herein incorporated by reference in their entirety. In other embodiments, the wet chemical processing chambers can be capsules or other types of chambers for cleaning wafers, such as those shown in U.S. Pat. Nos. 6,350,319; 6,423,642; and 6,413,436, all of which are also herein incorporated by reference in their entirety.

The main processing unit 100 can include various combinations of wet chemical processing chambers 170. For example, all of the chambers can be of a common type (e.g., electrochemical deposition chambers, cleaning chambers, etching chambers, etc.), or various combinations of different types of chambers can be mounted to the second deck 130. Suitable combinations of wet chemical processing chambers 170 and workpiece transport systems 190 are disclosed in the references incorporated above and U.S. Pat. Nos. 6,752,584 and 6,749,390; and U.S. Publication No. 2003/0159921, all of which are herein incorporated by reference.

3. Embodiments of Lift Rotate Units and Load/Unload Modules

Figure 11:
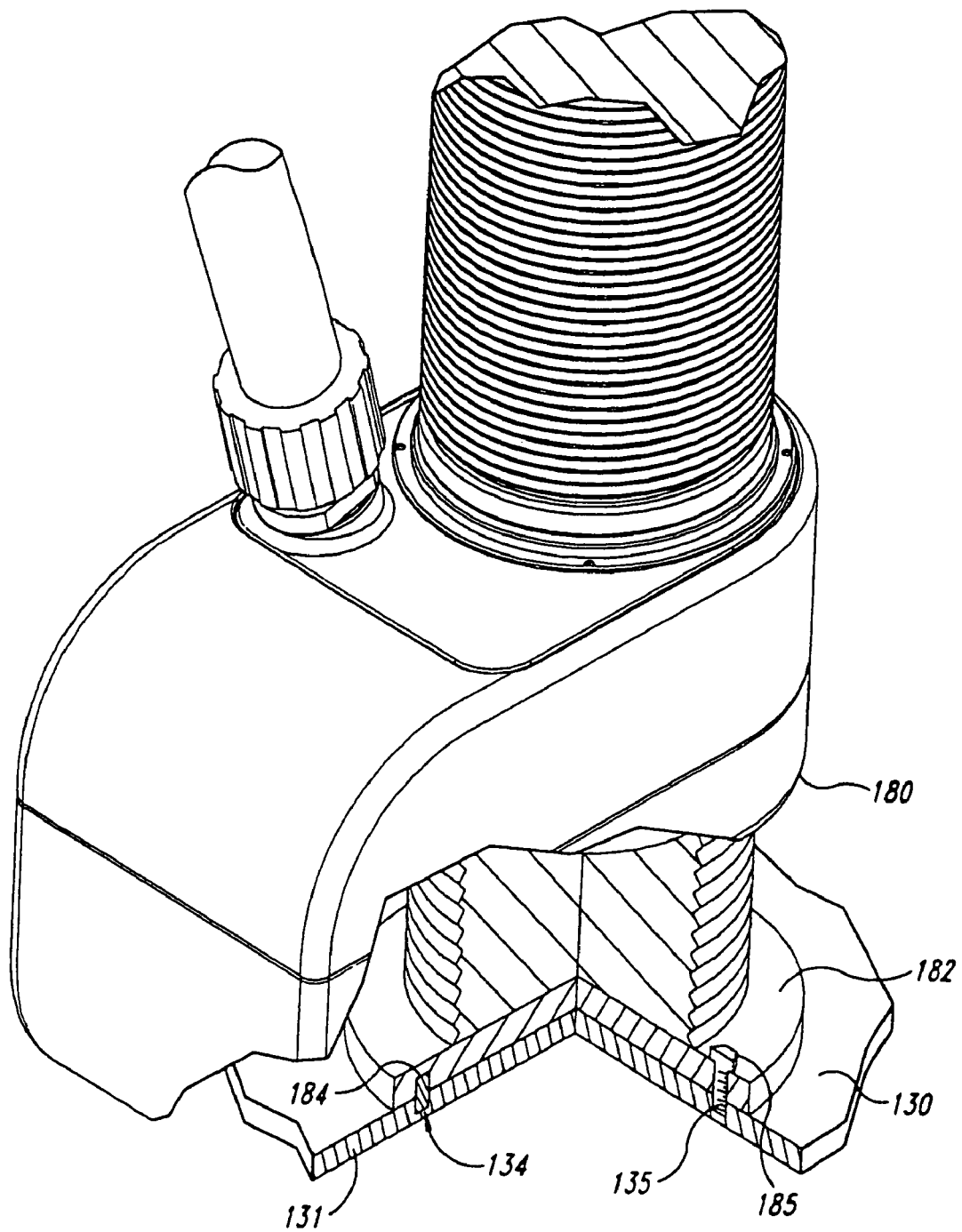
FIG. 11 is an isometric view with a cut-away portion of a lift-rotate unit mounted to a mounting module of a main processing unit in accordance with an embodiment of the invention.

FIG. 11 is an isometric cross-sectional view showing an embodiment of a lift-rotate unit 180 attached to the second deck 130. In this embodiment, the lift-rotate unit 180 includes a dimensionally stable collar 182. The collar 182 includes a plurality of interface members 184 arranged in a pattern to be aligned with the positioning elements 134 when the lift-rotate unit 180 is positioned at the desired location for operating the head 176 of the chamber 170 (FIG. 10). The lift-rotate unit 180 can further include a plurality of fasteners 185 arranged in the collar 182 to be aligned with attachment elements 135 in the second deck 130 for mounting the lift-rotate unit 180 to the second mounting module 120. The interface members 184, positioning elements 134, fasteners 185, and attachment elements 135 can have similar or identical structures to those described above with reference to FIG. 10.

4. Systems and Methods for Automated Robot Calibration

Figure 12:
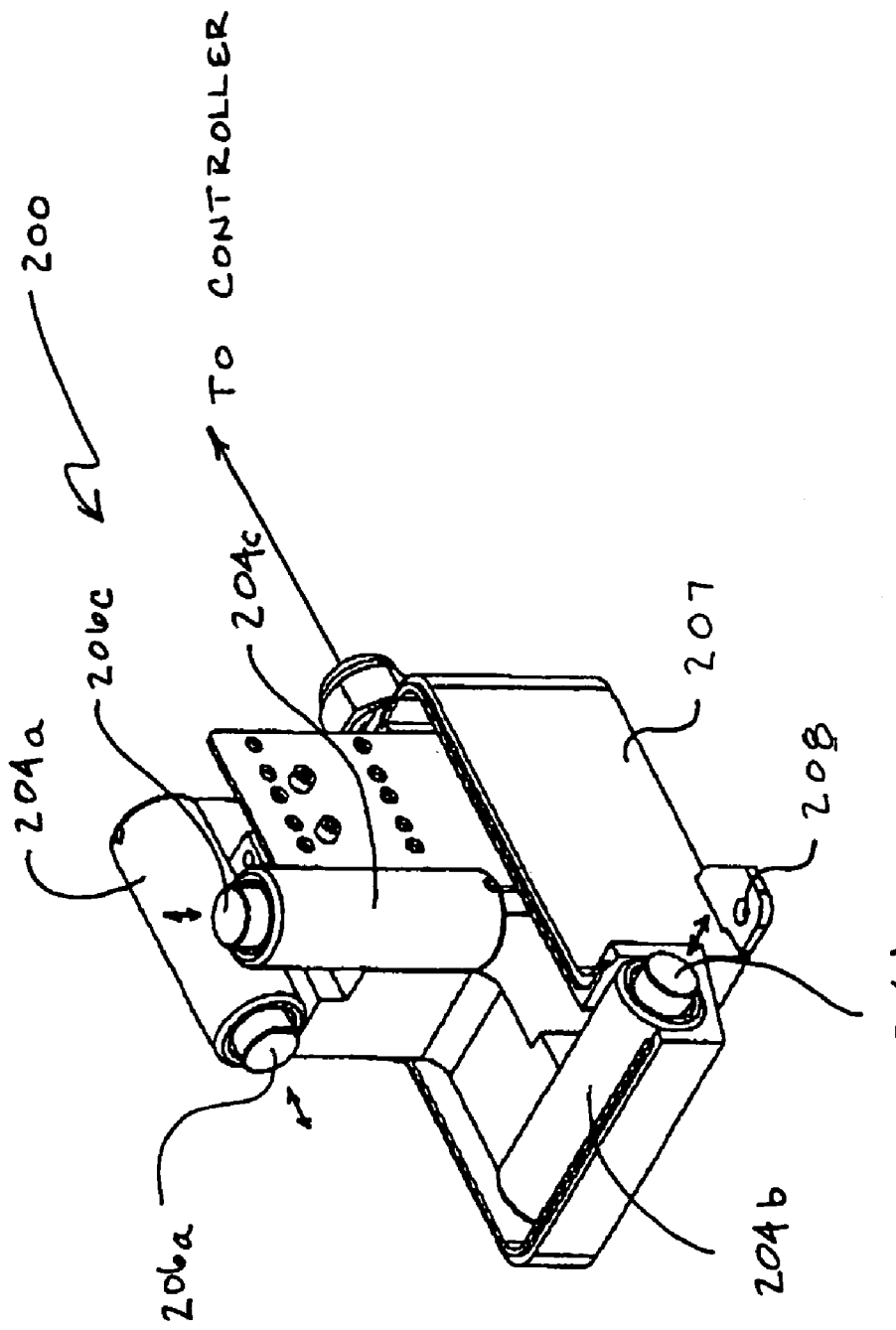
FIG. 12 is an isometric view of a portion of an automatic calibration system in accordance with an embodiment of the invention.

Another aspect of the present invention, as shown in FIG. 12, is directed toward systems and methods for automatically calibrating the first and second transport systems with respect to the first and second mounting modules. The calibration systems quickly position the end-effectors in a desired "zero" or origin position with respect to the axis of the track or another axis of the reference frame. The calibration systems can also determine an axial origin position of the robot with respect to the track and an elevation origin position of the end-effector. Several embodiments of calibration systems in accordance with this aspect of the invention are particularly efficacious when used with the first and second mounting module because this combination of features enables methods that automatically calibrate/align the transport systems to operate with the processing chambers or intermediate stations without manually teaching the robots the positions of the various components. As such, several methods in accordance with this aspect of the invention are expected to reduce the time to calibrate the transport systems to operate with the processing chambers and the load/unload module to only a few minutes instead of several hours.

The embodiment of the calibration system shown in FIG. 12 includes a sensor unit 200 and a controller (shown schematically). A sensor unit 200 can be attached to the first deck 30a (FIG. 1) and/or the second deck 130 (FIG. 7) at a known location with respect to the reference frame. In one embodiment, the reference frame generally has a first reference axis extending along a center line of the track, a second reference axis orthogonal to the first reference axis, and a third reference axis orthogonal to both the first and second reference axes. When the sensor unit 200 is positioned at a known location in the three-dimensional navigational volume of the reference frame defined by the corresponding mounting module, the sensor unit 200 can calibrate the first and/or second transport systems as set forth in U.S. application Ser. No. 10/860,385, (now U.S. Pat. No. 7,313,462) which application is herein incorporated by reference.

D. Additional Embodiments of Integrated Tool Assemblies

Figure 13:
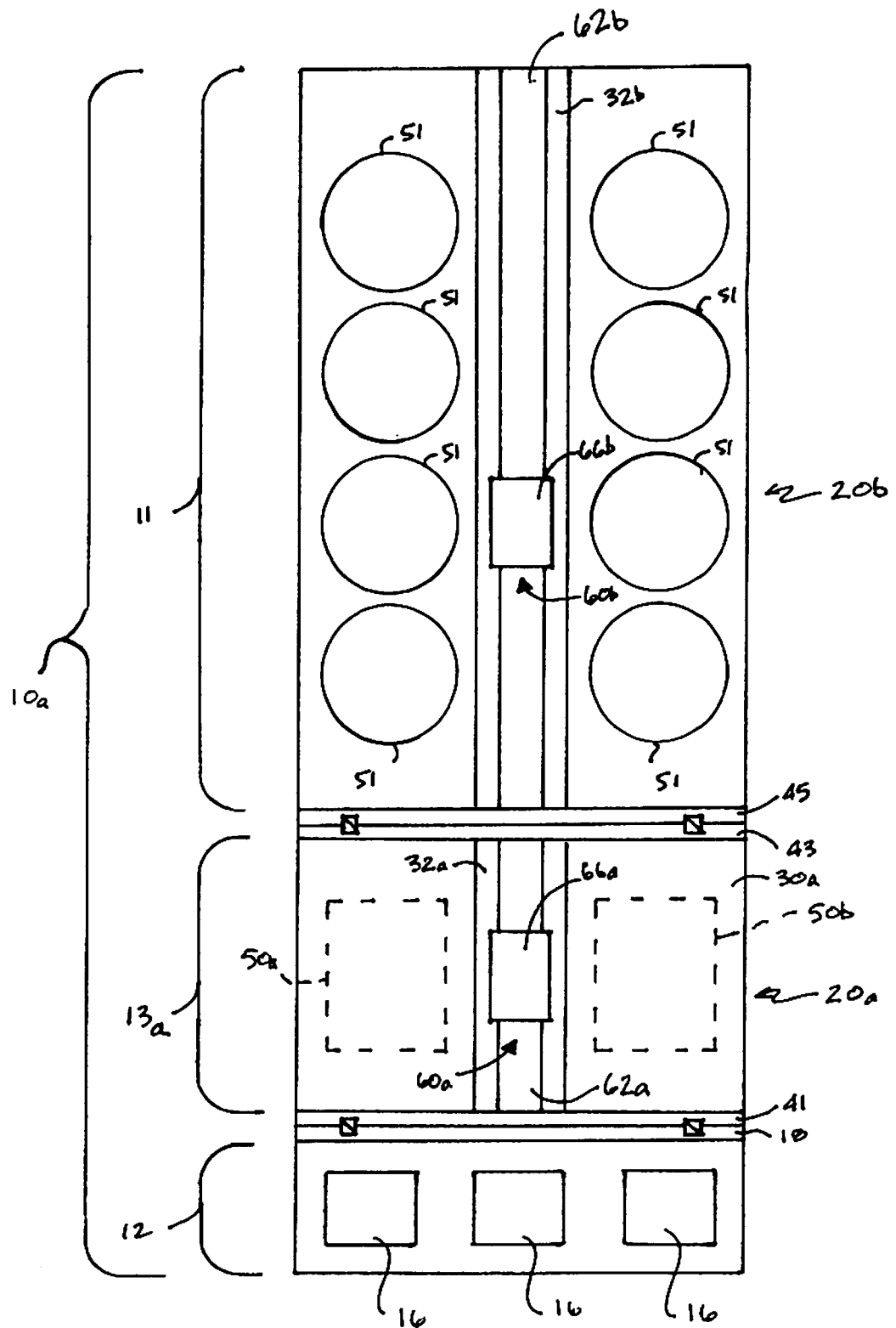
FIG. 13 is a top plan view of an integrated tool assembly in accordance with another embodiment of the invention.

FIG. 13 is a top plan view of an integrated tool assembly 10a in accordance with another embodiment of the invention. The integrated tool assembly 10a illustrated in FIG. 13 is similar to the integrated tool assembly 10 illustrated in FIG. 1, except that the integrated tool assembly 10a has an intermediate module 13a with a first platform 32a aligned with the second platform 32b of the main processing unit 11. The first transport system 60a of the intermediate module 13a accordingly has a first track 62a extending longitudinally in alignment with the second track 62b of the second transport system 60b. Other aspects of the integrated tool assembly 10a are substantially similar to those described above with reference to the integrated tool assembly 10 illustrated in FIG. 1, and thus like reference numbers refer to common elements in these figures.

Figure 14:
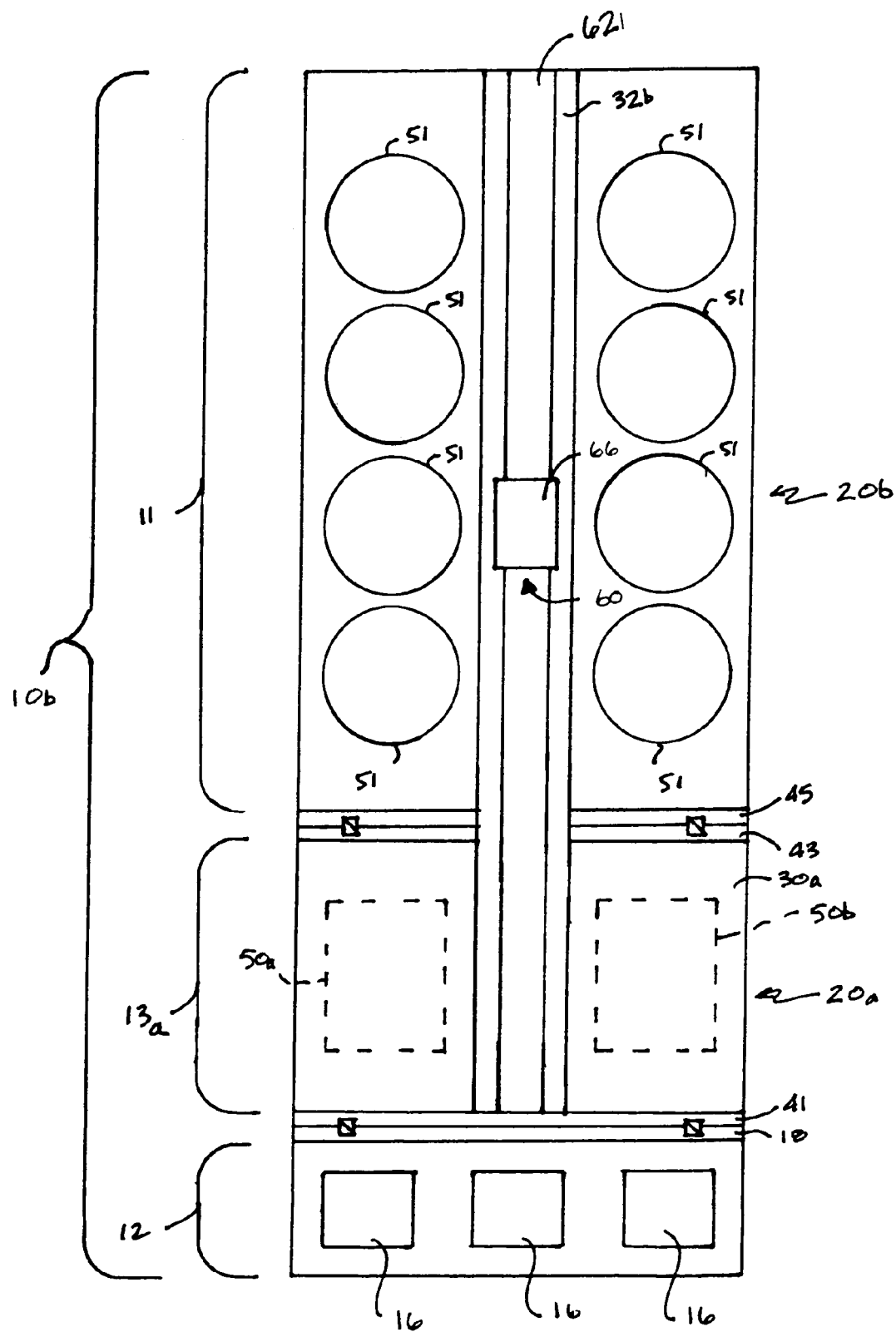
FIG. 14 is a top plan view of an integrated tool assembly in accordance with another embodiment of the invention.

FIG. 14 is a top plan view of an integrated tool assembly 10b in accordance with still another embodiment of the invention. The integrated tool assembly 10b is similar to the integrated tool assemblies 10 and 10a described above with reference to FIGS. 1 and 13, respectively, but the integrated tool assembly 10b illustrated in FIG. 14 has an intermediate module 13b without a separate transport system. As such, the main processing unit 11 and the intermediate module 13b share a common track 62 and a single robot 66.

Figure 15:
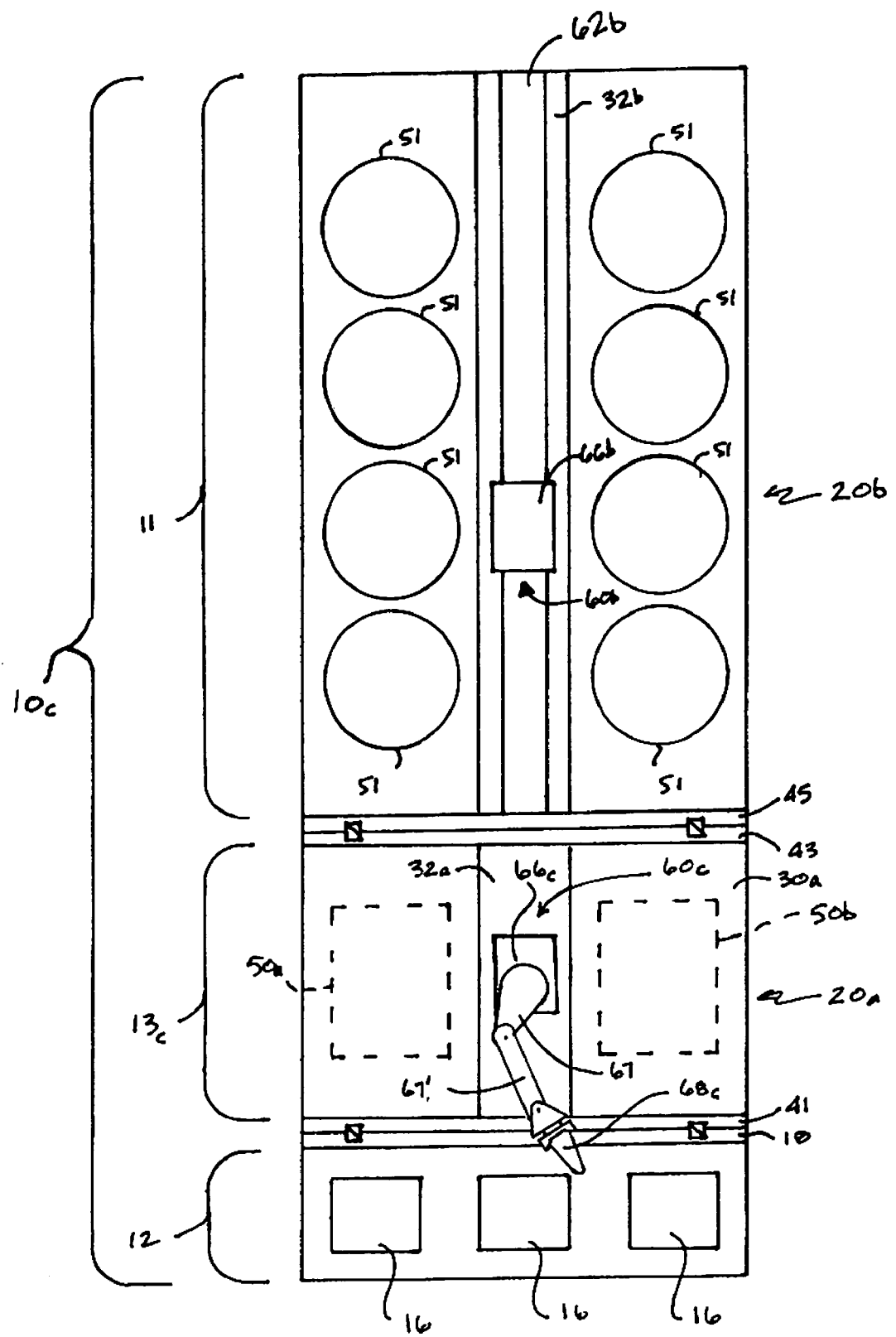
FIG. 15 is a top plan view of an integrated tool assembly in accordance with another embodiment of the invention.

FIG. 15 is a top plan view of another integrated tool assembly 10c in accordance with yet another embodiment of the invention. The integrated tool assembly 10c is similar to the integrated tool assembly 10a shown in FIG. 13, but the integrated tool assembly 10c has a transport system 60c with a multiple-link robot 66c having an arm with a first link 67 and a second link 67'. The first link 67 rotates about a fixed arm extension attached to a rotatable waist member, and the second link 67' rotates about a pivot point on the end of the first link 67. The robot 66c further includes an end-effector 68c rotatably attached to the second link 67' of the arm. The robot 66c shown in FIG. 15 is a rotary robot that does not translate along a linear track. In alternative embodiments, however, the robot 66c can move along a linear track as described above with respect to the robots 66a and 66b. The robot 66c can serve the load/unload module 12 and the first and second intermediate stations 50a-b. The robot 66b in the main processing unit 11 can load or remove the workpieces from the first and second intermediate stations 50a-b.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. An integrated tool assembly for processing of microfeature workpieces, comprising:
a load/unload module having first and second workpiece carriers and a first docking unit with first alignment elements;
an intermediate module including
(a) a dimensionally stable first mounting module defining a fixed first reference frame and having a front docking unit with front alignment elements engaged with the first alignment elements of the load/unload module for registering the load/unload module with the first reference frame of the first mounting module, a rear docking unit with rear alignment elements, a first deck between the front docking unit and the rear docking unit, positioning elements at the first deck, and attachment elements at the first deck, and
(b) a first device attached to the first deck for performing a function on a microfeature workpiece, the first device having a device interface member engaged with one of the positioning elements at the first deck and a device fastener engaged with one of the attachment elements at the first deck;
and a main processing unit including
(a) a second dimensionally stable mounting module defining a fixed second reference frame and having a second docking unit with second alignment elements engaged with the rear alignment elements of the rear docking unit for registering the first reference frame with the second reference frame, and also including positioning elements, and attachment elements;
(b) a wet chemical processing chamber carried by the second mounting module and having a chamber interface member engaged with one of the positioning elements of the second mounting module and a chamber fastener engaged with one of the attachment elements of the second mounting module; and
(c) a transport system carried by the second mounting module, the transport system having a transport interface member engaged with one of the positioning elements of the second mounting module and a transport fastener engaged with one of the attachment elements of the second mounting module.

2. The integrated tool assembly of claim 1 wherein the first mounting module further comprises a platform having positioning elements and attachment elements, and wherein the intermediate module further comprises (a) a track extending along the platform laterally in a width-wise direction of the tool assembly and having track interface members engaged with positioning elements at the platform and track fasteners engaged with attachment elements at the platform, and (b) a robot carried by the track to move linearly along the track.

3. The integrated tool assembly of claim 1 wherein:
the first mounting module further comprises a first platform having positioning elements and attachment elements, and wherein the intermediate module further comprises (a) a first track extending along the first platform laterally in a width-wise direction of the tool assembly and having track interface members engaged with positioning elements at the first platform and track fasteners engaged with attachment elements at the first platform, and (b) a first robot carried by the first track to move linearly along the second track; and
the second mounting module further comprises a second platform having positioning elements and attachment elements, and wherein the transport system of the main processing unit comprises (a) a second track extending longitudinally in a depth-wise direction of the tool assembly and having track interface members engaged with positioning elements at the second platform and track fasteners engaged with attachment elements at the second platform, and (b) a second robot carried by the second track to move linearly along the second track.

4. The integrated tool assembly of claim 3, further comprising a second device attached to the first deck for performing a function on a microfeature workpiece, the second device having a device interface member engaged with one of the positioning elements at the first deck and a device fastener engaged with one of the attachment elements at the first deck so that the second device is also precisely positioned in the first reference frame defined by the first mounting module.

5. The integrated tool assembly of claim 4 wherein:
the first device comprises a buffer mounted to one side of the first deck, the buffer having a plurality of workpiece support sites for supporting individual workpieces, a buffer interface member engaged with one of the positioning elements at the first deck, and a buffer fastener engaged with one of the attachment elements at the first deck; and
the second device comprises an annealing station mounted to another side of the first deck, the annealing station having an annealing interface member engaged with one of the positioning elements at the first deck, and an annealing fastener engaged with one of the attachment elements at the first deck.

6. The integrated tool assembly of claim 4 wherein:
the first device comprises a buffer mounted to one side of the first deck, the buffer having a plurality of workpiece support sites for supporting individual workpieces, a buffer interface member engaged with one of the positioning elements at the first deck, and a buffer fastener engaged with one of the attachment elements at the first deck; and
the second device comprises a metrology station mounted to another side of the first deck, the metrology station having a metrology interface member engaged with one of the positioning elements at the first deck, and a metrology fastener engaged with one of the attachment elements at the first deck.

7. The integrated tool assembly claim 1 wherein the first mounting module further comprises a first platform extending between the first device and a second device, and wherein the intermediate module further comprises (a) a first track extending along the first platform in a depth-wise direction of the tool assembly between the first and second devices and the first track having track interface members engaged with positioning elements at the first platform and track fasteners engaged with attachment elements at the first platform, and (b) a first robot carried by the first track to move linearly between the first and second devices.

8. The integrated tool assembly of claim 7 wherein the second mounting module further comprises a second platform having positioning elements and attachment elements, and wherein the transport system of the main processing unit comprises (a) a second track extending longitudinally in a depth-wise direction of the tool assembly and having track interface members engage with positioning elements at the second platform and track fasteners engaged with attachment elements at the second platform, and (b) a second robot carried by the second track to move linearly along the second track.

9. The integrated tool assembly of claim 8, wherein: the first device comprises a buffer mounted to one side of the first deck, the buffer having a plurality of workpiece support sites for supporting individual workpieces, a buffer interface member engaged with one of the positioning elements at the first deck, and a buffer fastener engaged with one of the attachment elements at the first deck; and the second device comprises an annealing station mounted to another side of the first deck, the annealing station having an annealing interface member engaged with one of the positioning elements at the first deck, and an annealing fastener engaged with one of the attachment elements at the first deck.

10. The integrated tool assembly of claim 8 wherein: the first device comprises a buffer mounted to one side of the first deck, the buffer having a plurality of workpiece support sites for supporting individual workpieces, a buffer interface member engaged with one of the positioning elements at the first deck, and a buffer fastener engaged with one of the attachment elements at the first deck; and the second device comprises a metrology station mounted to another side of the first deck, the metrology station having a metrology interface member engaged with one of the positioning elements at the first deck, and a metrology fastener engaged with one of the attachment elements at the first deck.

11. The integrated tool assembly of claim 1 wherein the first deck further comprises a first rigid panel, a second rigid panel juxtaposed under the first rigid panel, and braces between the first and second panels, and wherein the first and second panels are fixedly attached to the braces.

12. The integrated tool assembly of claim 11 wherein the braces comprise joists having through holes, and wherein the deck further comprises bolts in the through holes that compress the joists between the first and second rigid panels.

13. The integrated tool assembly of claim 1, wherein the intermediate module further comprising comprises a robot having a rotatable waist member, an arm fixedly attached to the waist member, a first end-effector attached directly to the arm without an intervening rotatable link between the arm and the first end-effector, and a second end-effector carried by the arm, wherein the first and second end-effectors coaxially rotate about a common axis.

14. An integrated tool assembly for processing of microfeature workpieces, comprising:
    a load/unload module having first alignment elements;
    an intermediate module having front alignment elements engaged with the first alignment elements to register the load/unload module with the intermediate module, a first robot carried by a first track to move linearly in a width-wise direction of the tool assembly, a first device fixed relative to the first track for performing a function on a microfeature workpiece, and rear alignment elements; and
    a main processing unit having second alignment elements engaged with the rear alignment elements of the intermediate module to register the intermediate module with the main processing unit, a second robot carried by a second track to move linearly along the second track, and a wet chemical processing chamber fixed relative to the second track.

15. The integrated tool assembly of claim 14 wherein the intermediate module further comprises a second device fixed relative to the first track, and the main processing unit further comprises a plurality of wet chemical chambers fixed relative to the second track.

16. The integrated tool assembly of claim 15 wherein the first device comprises a buffer and the second device comprises an annealing station.

17. The integrated tool assembly of claim 15 wherein the first device comprises a buffer and the second device comprises a metrology station.

18. The integrated tool assembly of claim 15 wherein the first and second devices comprises additional wet chemical processing stations.

19. The integrated tool assembly of claim 15 wherein:
    the first device comprises a buffer;
    the second device comprises an annealing station; and
    the wet chemical processing station comprises an electrochemical deposition chamber.

20. The integrated tool assembly of claim 14 wherein the main processing unit further comprises a plurality of wet chemical processing chambers configured to electrochemically deposit material onto workpieces.

21. The integrated tool assembly of claim 14 wherein the main processing unit further comprises a plurality of wet chemical processing chambers configured to clean surfaces of workpieces.

* * * * *